(12) United States Patent
Shin et al.

(10) Patent No.: US 8,357,600 B2
(45) Date of Patent: Jan. 22, 2013

(54) METHOD FOR FABRICATING BURIED GATE USING PRE LANDING PLUGS

(75) Inventors: Jong-Han Shin, Gyeonggi-do (KR); Jum-Yong Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 468 days.

(21) Appl. No.: 12/613,708

(22) Filed: Nov. 6, 2009

(65) Prior Publication Data
US 2011/0003459 A1 Jan. 6, 2011

(30) Foreign Application Priority Data
Jul. 3, 2009 (KR) .................. 10-2009-0060879

(51) Int. Cl.
*H01L 21/336* (2006.01)
*H01L 21/3205* (2006.01)
*H01L 21/8242* (2006.01)

(52) U.S. Cl. ........ 438/586; 438/239; 438/589; 438/672; 438/700; 257/E21.428; 257/E21.429; 257/E21.646

(58) Field of Classification Search .................. 438/586, 438/589, 672, 700, 239; 257/E21.428, E21.429, 257/E21.646
See application file for complete search history.

(56) References Cited

U.S. PATENT DOCUMENTS

| 7,071,059 | B1 * | 7/2006 | Kim ............................. | 438/589 |
| 7,189,605 | B2 * | 3/2007 | Lee ............................. | 438/200 |
| 2006/0148174 | A1 | 7/2006 | Kim | |
| 2006/0234437 | A1 * | 10/2006 | Kim et al. .................... | 438/218 |

FOREIGN PATENT DOCUMENTS

| KR | 1020070069755 | 7/2007 |
| KR | 1020090066941 | 6/2009 |

OTHER PUBLICATIONS

Office Action issued by the State Intellectual Property Office of People's Republic of China on Oct. 29, 2012.

* cited by examiner

*Primary Examiner* — Zandra Smith
*Assistant Examiner* — Toniae Thomas
(74) *Attorney, Agent, or Firm* — IP & T Group LLP

(57) ABSTRACT

A method for fabricating a semiconductor device is provided, the method includes forming a plug conductive layer over an entire surface of a substrate, etching the plug conductive layer to form landing plugs, etching the substrate between the landing plugs to form a trench, forming a gate insulation layer over a surface of the trench and forming a buried gate partially filling the trench over the gate insulation layer.

41 Claims, 21 Drawing Sheets

US 8,357,600 B2

METHOD FOR FABRICATING BURIED GATE USING PRE LANDING PLUGS

CROSS-REFERENCE(S) TO RELATED APPLICATIONS

The present invention claims priority of Korean Patent Application No. 10-2009-0060879, filed on Jul. 3, 2009, which is incorporated herein by reference in its entirety.

BACKGROUND OF THE INVENTION

The present invention relates to a method for fabricating a semiconductor device, and more particularly, to a method for fabricating a buried gate.

In a 60 nm DRAM process, a buried gate is formed in order to increase the integration of transistors in a cell, simplify the process and enhance device characteristics such as a leakage current.

A method for fabricating a buried gate is performed by forming a trench and burying a gate in the trench. Accordingly, the method can minimize interference between a bit line and gates, decrease the number of film stacks, and decrease a total capacitance of the entire cells, thereby improving refresh characteristics.

FIGS. 1A to 1E are cross-sectional views illustrating a method for fabricating a semiconductor device having a buried gate, in accordance with prior art.

Referring to FIG. 1A, a device isolation layer 12 is formed on a substrate 11, in which a cell region and a peripheral region are defined.

Thereafter, the substrate 11 corresponding to the cell region is etched using a hard mask layer 13 to form a trench 14 and then to form a first gate insulation layer 15 in the trench 14. Thereafter, a buried gate 16 partially filling the trench 14 is formed on the first gate insulation layer 15.

Referring to FIG. 1B, the hard mask layer 13 is removed, and then a sealing layer 17 sealing a top surface of the buried gate 16 is formed.

Thereafter, a peri (that is, peripheral) open process is performed to open a peripheral region such that the seal layer 17 is left only on the cell region.

Thereafter, a gate oxidation process is performed with respect to the peripheral region to form a second gate insulation layer 18.

Referring to FIG. 1C, a gate conductive layer 19 is formed on the second gate insulation layer 18, and then a process of forming a bit line contact hole 20 is performed for bit line contact at the cell region. As a result, the sealing layer 17 (see FIG. 1B) becomes a sealing pattern 17A partially exposing the substrate 11.

Referring to FIG. 1D, a metal layer is deposited such that the bit line contact hole 20 is filled, and then a hard mask layer is formed on the deposited metal layer.

Thereafter, a gate etch is performed which etches the hard mask layer, the metal layer, the gate conductive layer and the first gate insulation layer. As a result, a gate (hereinafter referred to as a 'peri gate (PG)') for a transistor of the peripheral region, including a second gate insulation layer pattern 18A, a gate conductive pattern 19A, a gate metal pattern 21B and a gate hard mask pattern 22B, stacked in the order named, is formed in the peripheral region. While the peri gate (PG) is formed, a bit line (BL), which also functions as a bit line contact and includes a bit line interconnection pattern 21A and a bit line hard mask pattern 22A stacked in the order named, is formed in the cell region.

Referring to FIG. 1E, an interlayer dielectric is formed on an entire surface of the substrate 11. Thereafter, a contact forming process for forming a storage node contact 24 in the cell region is performed by etching the interlayer dielectric. This contact forming process is performed even with respect to a surface of the substrate, so that the sealing pattern 17A (see FIG. 1D) and the interlayer dielectric are partially etched and become a final sealing pattern 17B and an interlayer dielectric 23.

In the foregoing prior art, after the buried gate 16 is formed in the cell region, the sealing process for preventing an oxidation of the buried gate 16 is performed by using the sealing layer 17. Thereafter, the gate oxidation and the gate conductive layer depositing process for forming the transistor of the peripheral region are performed by opening only the peripheral region. Thereafter, the cell region is again opened, and the contact etching process for forming the bit line contact hole is performed.

However, although the prior art seals the cell region by using the sealing layer 17, while the gate oxidation process is performed in the peripheral region, the prior art may prevent the buried gate 16 from being oxidized due to an oxygen source (See the reference symbol 'A' of FIG. 1B).

Also, since after the bit line (BL) is formed in the cell region, the storage node contact 24 is formed, thus it may be difficult to secure a contact open area for forming the storage node contact 24. In addition, since the contact open area is small, an interfacial resistance between the storage node contact and the substrate is increased.

Furthermore, in the prior art, since while the storage node contact process or the bit line contact process is performed, the substrate may be lost due to an over etch (see the reference symbol 'B' of FIG. 1C), GIDL (Gate Induced Drain Leakage) between the storage node contact and the buried gate is increased, and the possibility causing a self aligned contact fail may be increased.

To overcome the above problem, a method has been proposed that elevates a portion where a landing plug is formed by employing a hard mask layer, removing the hard mask layer, and forming a landing plug. However, this method has a difficulty in controlling a height of a contact above a predetermined height, since while the hard mask layer is removed, a contact widening occurs that increases the possibility of a bridge between contacts and an etch process; a CMP (Chemical Mechanical Polishing) process may also be performed in a mid-process.

SUMMARY OF THE INVENTION

Some embodiments are directed to a method for fabricating a semiconductor device that can prevent a buried gate from being oxidized due to a subsequent process.

Some embodiments are directed to a method for fabricating a semiconductor device that can decrease the contact resistance by increasing the contact area between a bit line contact and a substrate, and between a storage node contact and the substrate.

Some embodiments are directed to a method for fabricating a semiconductor device that can decrease GIDL (Gate Induced Drain Leakage) between a bit line contact and a buried gate, and between a storage node contact and the buried gate, and also prevent self aligned contact fail.

Some embodiments are directed to a method for fabricating a semiconductor device, the method comprising forming a plug conductive layer over an entire surface of a substrate, etching the plug conductive layer to form landing plugs, etching the substrate between the landing plugs to form a trench, forming a gate insulation layer over a surface of the trench and forming a buried gate partially filling the trench over the gate insulation layer.

Some embodiments are directed to a method for fabricating a semiconductor device, the method comprising forming a plug conductive layer over an entire surface of a substrate, etching the plug conductive layer and the substrate to form a first trench, forming a device isolation layer gap-filling the first trench, etching the plug conductive layer to form landing plugs, etching the substrate between the landing plugs to form a second trench, forming a gate insulation layer over a surface of the second trench and forming a buried gate partially filling the second trench over the gate insulation layer.

Some embodiments are directed to a method for fabricating a semiconductor device, the method comprising forming a device isolation layer in a substrate, forming a plug conductive layer over an entire surface of the substrate, etching the plug conductive layer to form landing plugs, etching the substrate between the landing plugs to form a trench, forming a gate insulation layer over a surface of the trench and forming a buried gate partially filling the trench over the gate insulation layer.

Some embodiments are directed to a method for fabricating a semiconductor device, the method comprising selectively forming a gate insulation layer and a gate conductive layer over a peripheral region of a substrate in which a cell region and the peripheral region are defined, forming a plug conductive layer over an entire surface of the substrate, etching the plug conductive layer to form landing plugs in the cell region, etching the substrate between the landing plugs to form a trench, forming a gate insulation layer over a surface of the trench, forming a buried gate partially filling the trench over the gate insulation layer and performing a gate patterning for forming a gate in the peripheral region.

Some embodiments are directed to a method for fabricating a semiconductor device, the method comprising selectively forming a gate insulation layer and a gate conductive layer over a peripheral region of a substrate in which a cell region and the peripheral region are defined, forming a plug conductive layer over an entire surface of the substrate, etching the plug conductive layer and the substrate to form a first trench, forming a device isolation layer gap-filling the first trench, etching the plug conductive layer to form landing plugs in the cell region, etching the substrate between the landing plugs to form a second trench, forming a gate insulation layer over a surface of the second trench, forming a buried gate partially filling the second trench over the gate insulation layer and performing a gate patterning for forming a gate in the peripheral region.

Some embodiments are directed to a method for fabricating a semiconductor device, the method comprising forming a device isolation layer in a substrate in which a cell region and a peripheral region are defined, selectively forming a gate insulation layer and a gate conductive layer over the substrate of the peripheral region, forming a plug conductive layer over an entire surface of the substrate, etching the plug conductive layer to form landing plugs in the cell region, etching the substrate between the landing plugs to form a trench, forming a gate insulation layer over a surface of the trench, forming a buried gate partially filling the trench over the gate insulation layer and performing a gate patterning for forming a gate in the peripheral region.

DESCRIPTION OF SPECIFIC EMBODIMENTS

Figure 1A:
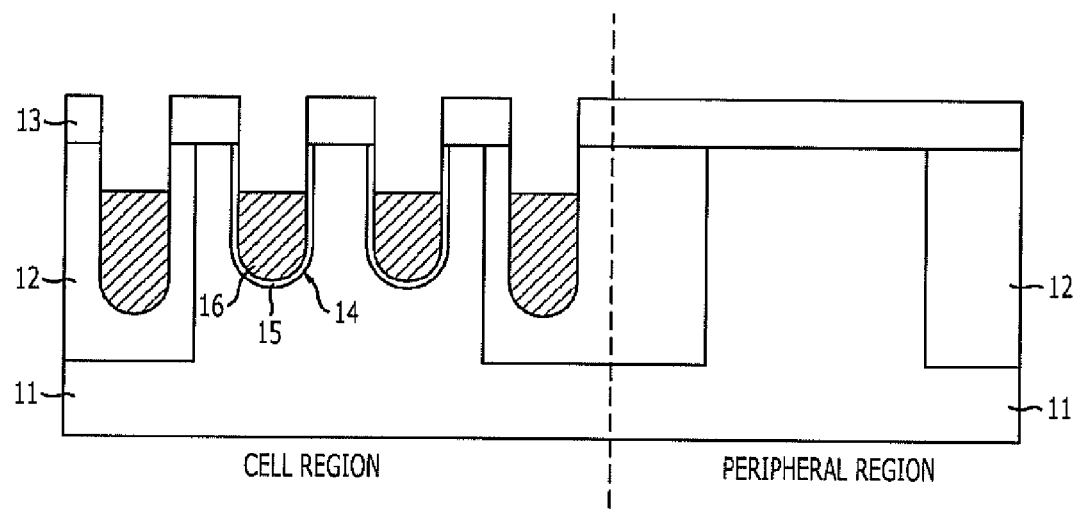
FIGS. 1A to 1E are cross-sectional views illustrating a method for fabricating a semiconductor device having a buried gate, in accordance with prior art.
Figure 1B:
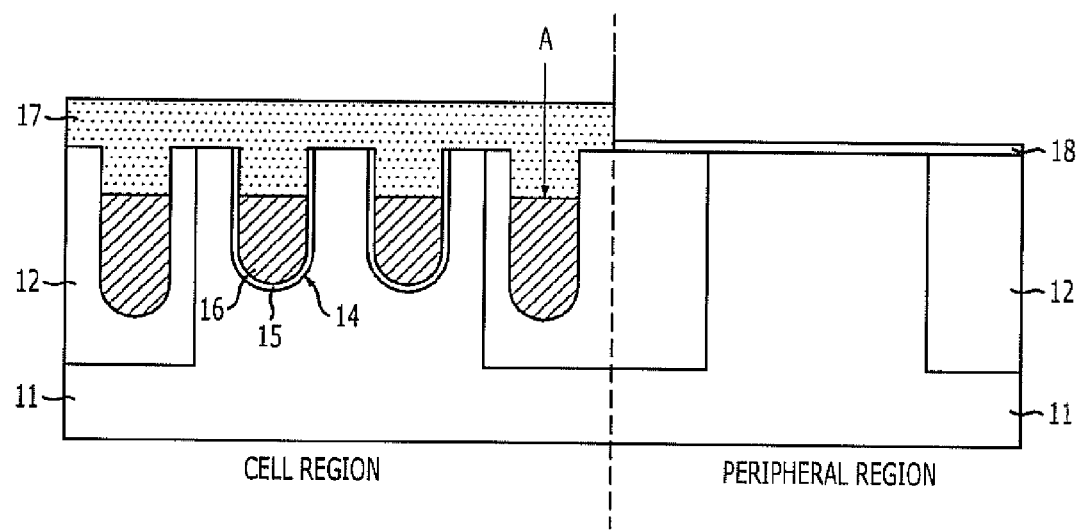
Figure 1C:
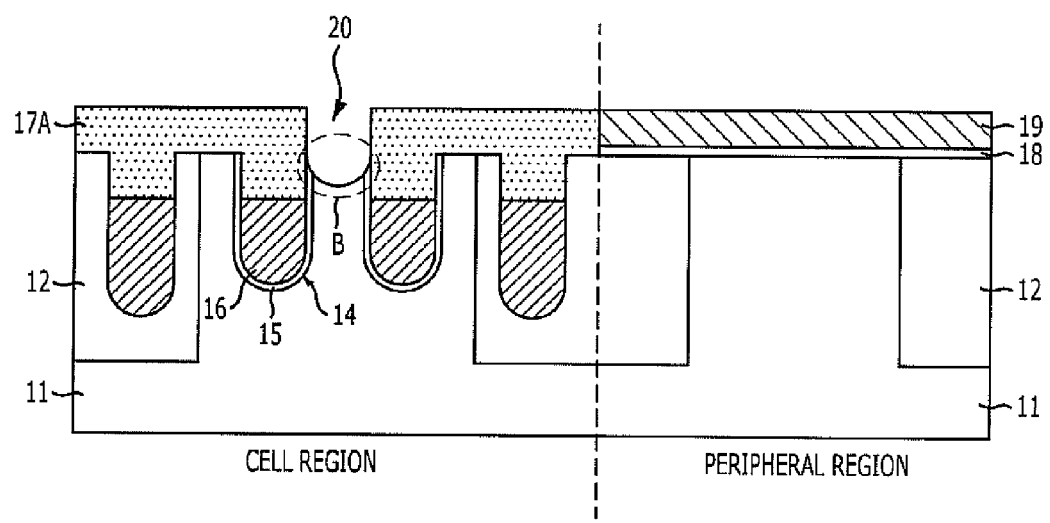
Figure 1D:
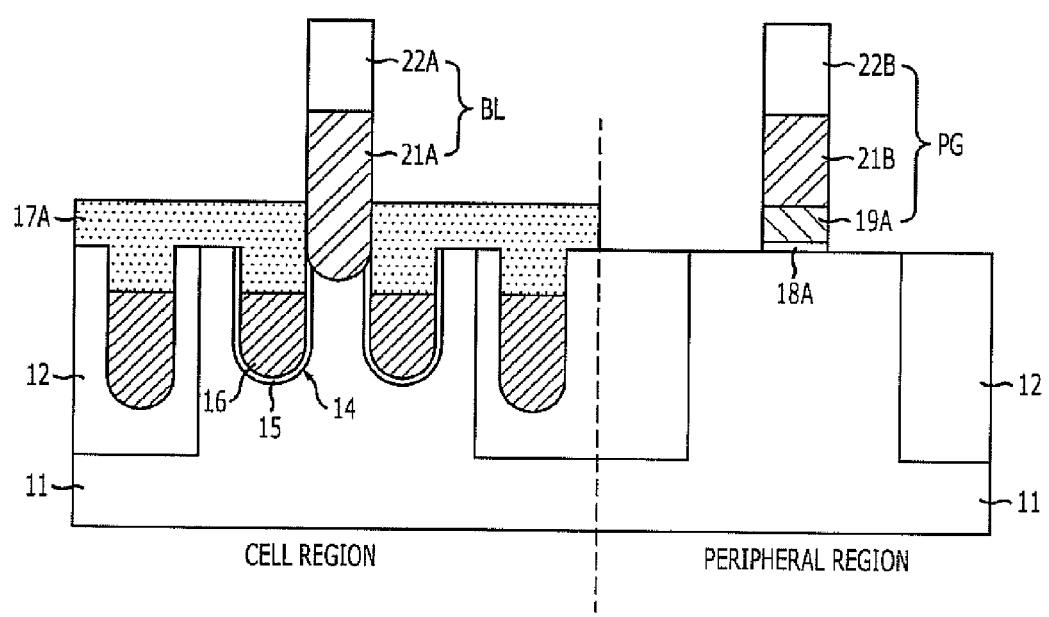
Figure 1E:
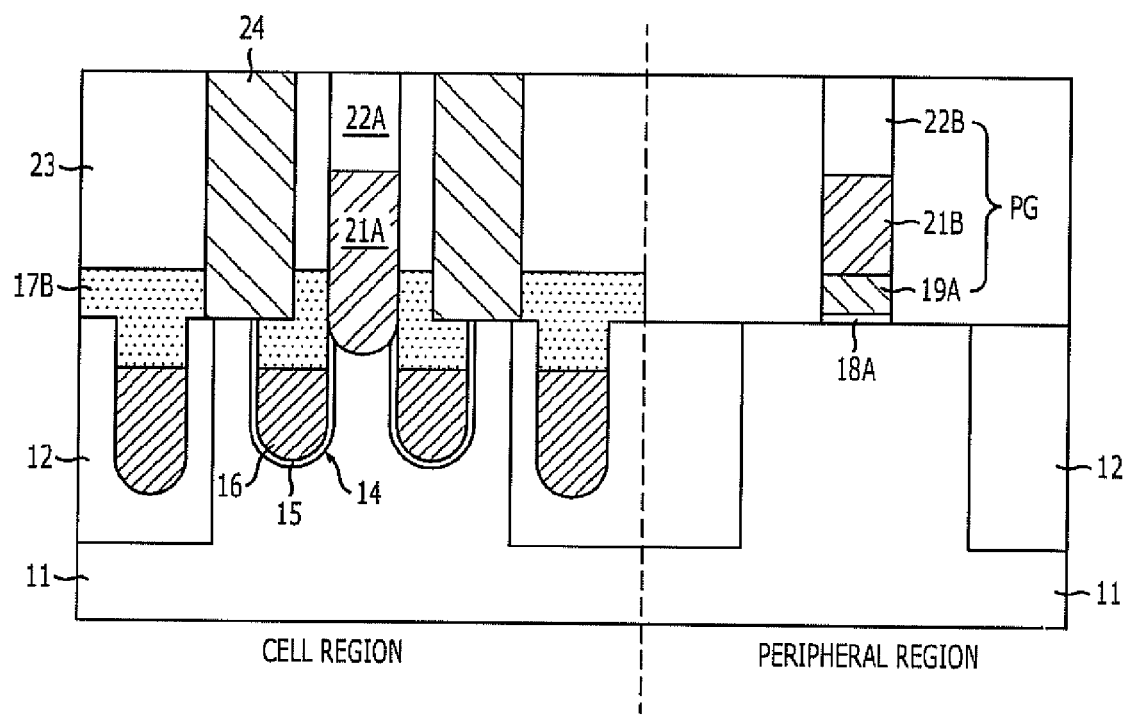

Other objects and advantages can be understood by the following description, and become apparent with reference to the various embodiments described herein.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings.

FIGS. 2A to 2H are cross-sectional views illustrating a method for fabricating a semiconductor device, in accordance with a first embodiment.

Figure 2A:
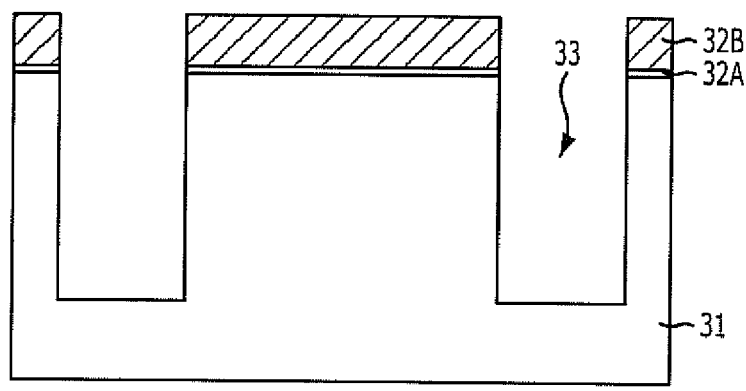
FIGS. 2A to 2H are cross-sectional views illustrating a method for fabricating a semiconductor device in accordance with a first embodiment.

Referring to FIG. 2A, a substrate 31 is etched by using a structure stacked in the order of a pad oxide layer 32A and a first hard mask layer 32B to form a first trench 33, where a device isolation layer is being formed. Here, the first hard mask layer 32B may include a polysilicon layer or a nitride layer. Preferably, the first hard mask layer 32B may have a stack structure of a polysilicon layer and a nitride layer.

Figure 2B:
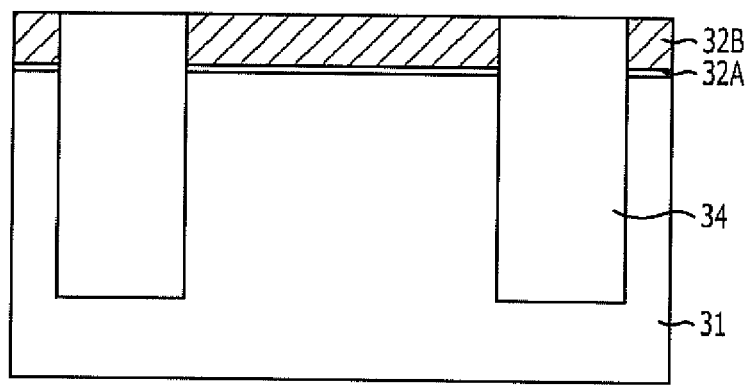

Referring to FIG. 2B, a device isolation layer 34 gap-filling the first trench 33 (see FIG. 2A) is formed. The above process of forming the device isolation layer 34 is called 'STI (Shallow Trench Isolation)' process, and the device isolation layer 34 is formed by forming the first trench 33, and then gap-filling the first trench 33 with an insulating layer.

Figure 2C:
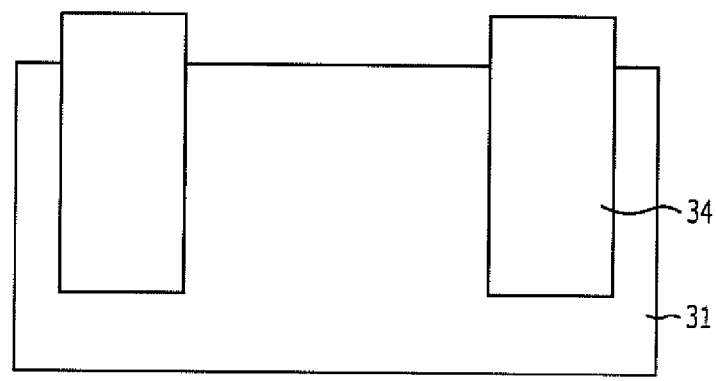

Referring to FIG. 2C, the first hard mask layer 32A (see FIG. 2B) and the pad oxide layer 32B are removed, for example, by using a dry etch and/or a wet etch.

Figure 2D:
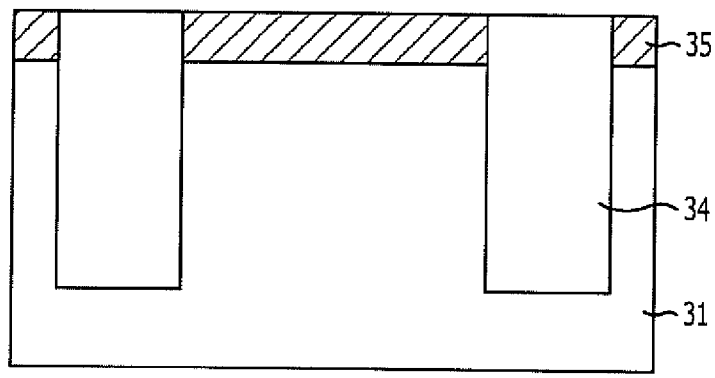

Referring to FIG. 2D, a plug conductive layer 35 is formed on an entire surface of the substrate 31 and is planarized until a top surface of the device isolation layer 34 is exposed. At this point, the plug conductive layer 35 includes a polysilicon layer. The plug conductive layer 35 may be formed in a thickness range of 600-1500 Å, although other thickness ranges are contemplated. Also, the plug conductive layer 35 may include a metal layer such as a tungsten layer, or the like.

Figure 2E:
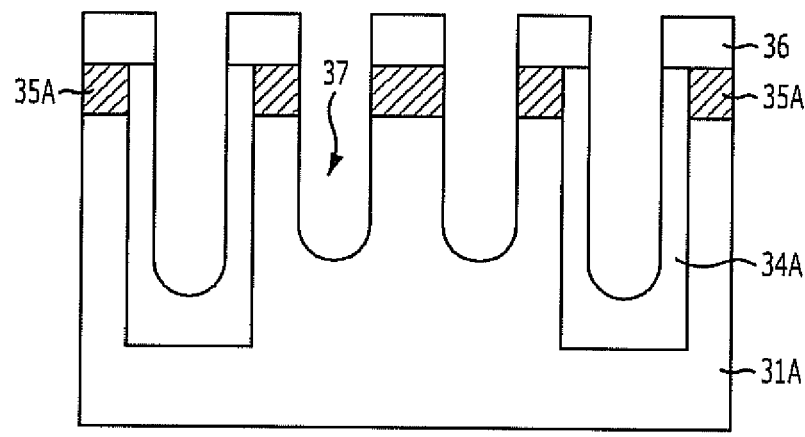

Referring to FIG. 2E, a second hard mask layer is formed on the plug conductive layer 35 (see FIG. 2D), and then a mask and an etch process for a buried gate process is performed. For example, the second hard mask layer is etched by using a photoresist pattern (not shown) to form a second hard mask pattern 36, and then the plug conductive layer 35 and the substrate 31 (see FIG. 2D) are etched using the second hard mask pattern 36 as an etch barrier, resulting with an etched substrate 31A and an etched plug conductive layer 35A, referred to simply as the substrate 31A and the plug conductive layer 35A herein. As a result, a second trench 37 having a predetermined depth is formed. The second trench 37 may be formed by simultaneously etching the substrate 31A and the device isolation layer 34. The second hard mask layer may include a nitride layer.

Thus, by etching the plug conductive layer using the second hard mask layer, a first and a second landing plug 35A is formed, and successively by etching the substrate between the landing plugs 35A, the second trench 37 is formed. At this time, the device isolation layer 34 has a hollow structure 34A.

Figure 2F:
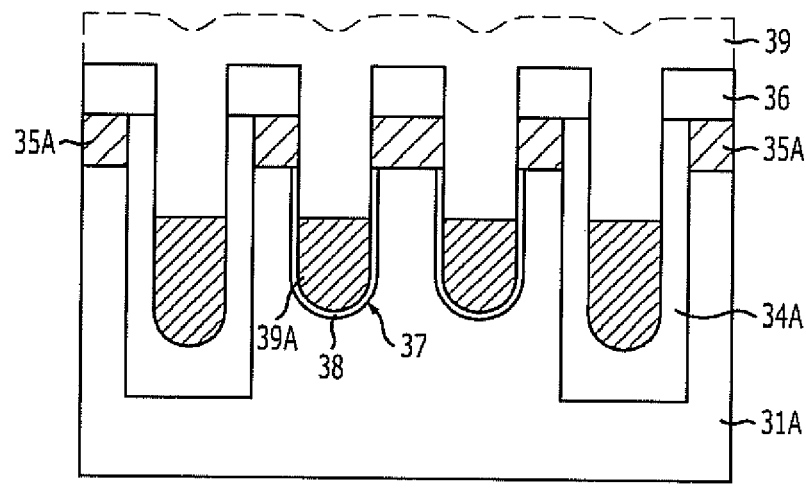

Referring to FIG. 2F, a gate insulation layer 38 is formed on a surface of the second trench 37, and then a gate conductive layer 39 is deposited on an entire surface of the resultant substrate such that the second trench 37 is gap-filled with the gate conductive layer 39. The gate conductive layer 39 includes a titanium nitride (TiN) layer, a tantalum nitride (TaN) layer, a tungsten (W) layer, or the like. For example, the gate conductive layer 39 may be formed by conformally and thinly depositing a titanium nitride layer (or tantalum nitride layer) having a large work function and then gap-filling a tungsten layer for lowering the resistance. Also, the gate conductive layer 39 may be formed by stacking a titanium nitride layer and a tantalum nitride layer, or sequentially stacking a titanium nitride layer, a tantalum nitride layer and a tungsten layer. Preferably, the titanium nitride layer is formed in a thickness range of 20-80 Å, although other thickness ranges are contemplated.

Next, the gate conductive layer 39 is planarized by using a CMP (Chemical Mechanical Polishing) process, or the like, such that a top surface of the second hard mask layer 36A is exposed, and an etchback is successively performed to form a buried gate 39A. The top surface of the buried gate 39A may be leveled lower than the top surface of the substrate 31A.

Figure 2G:
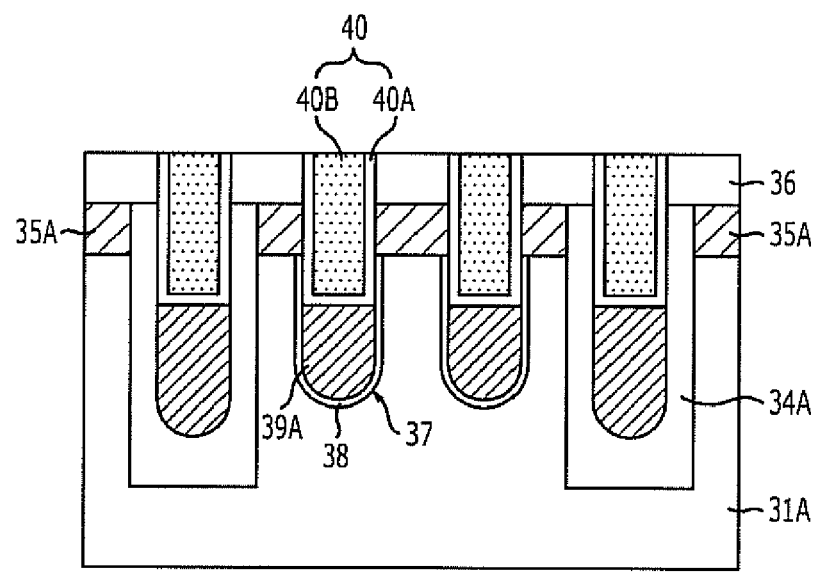

Referring to FIG. 2G, a sealing layer 40 sealing an upper portion of the buried gate 39A is formed. The sealing layer 40 may be one selected from the group consisting of an oxide layer, a nitride layer and a stack structure including an oxide layer and a nitride layer. For example, the sealing layer 40 may be formed by thinly sealing a sealing nitride layer 40A and gap-filling a sealed space with a sealing oxide layer 40B such as an SOD (Spin On Dielectric), or the like.

If the sealing layer 40 covers the second hard mask layer 36, the sealing layer 40 may be planarized such that the top surface of the second hard mask layer 36 is exposed.

Figure 2H:
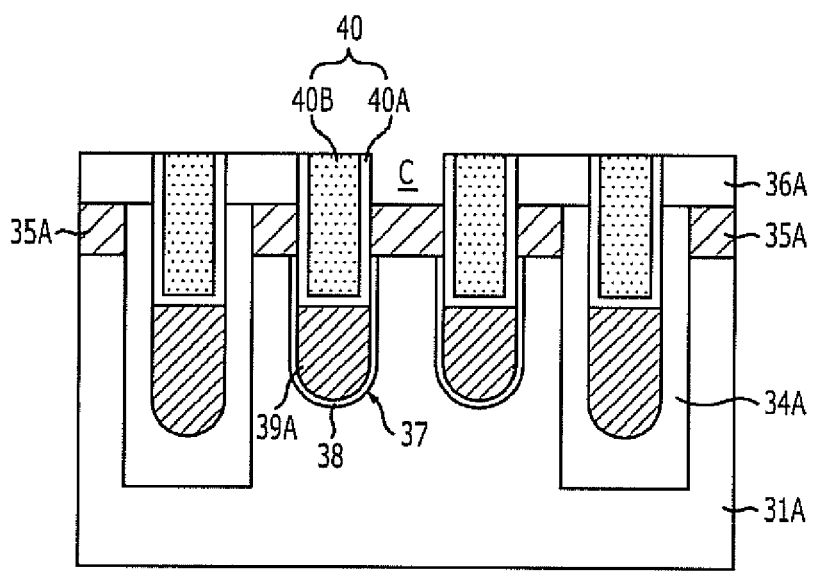

Referring to FIG. 2H, the second hard mask layer 36 is etched by using a contact mask (not shown) to form a contact hole 'C' exposing a top surface of the landing plug 35A. The second hard mask layer 36, which does not have the contact hole 'C', remains a second hard mask pattern 36A. The contact hole 'C' includes a bit line contact hole. The contact hole 'C' may be formed after an interlayer insulating layer is formed on the sealing layer 40.

FIGS. 3A to 3F are cross-sectional views illustrating a method for fabricating a semiconductor device in accordance with a second embodiment.

Figure 3A:
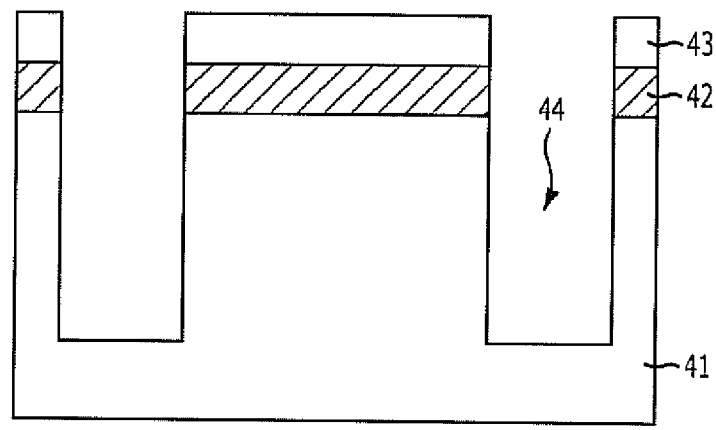
FIGS. 3A to 3F are cross-sectional views illustrating a method for fabricating a semiconductor device in accordance with a second embodiment.

Referring to FIG. 3A, a plug conductive layer is formed on an entire surface of a substrate. The plug conductive layer includes a polysilicon layer, and is formed in a thickness range of 600-1500 Å, although other thickness ranges are contemplated. Also, the plug conductive layer may include a metal layer such as a tungsten layer, or the like.

Next, a hard mask layer is formed on the plug conductive layer, and then an STI (Shallow Trench Isolation) process is performed. That is, the hard mask layer is etched by using a device isolation mask (not shown) and then the plug conductive layer and the substrate are etched to form a first trench 44 having a predetermined depth at a portion serving as a device isolation layer. The hard mask layer 43 may include a nitride layer. FIG. 3A illustrates a substrate 41 having a first trench 44, a plug conductive layer 42 and a hard mask layer 43.

Figure 3B:
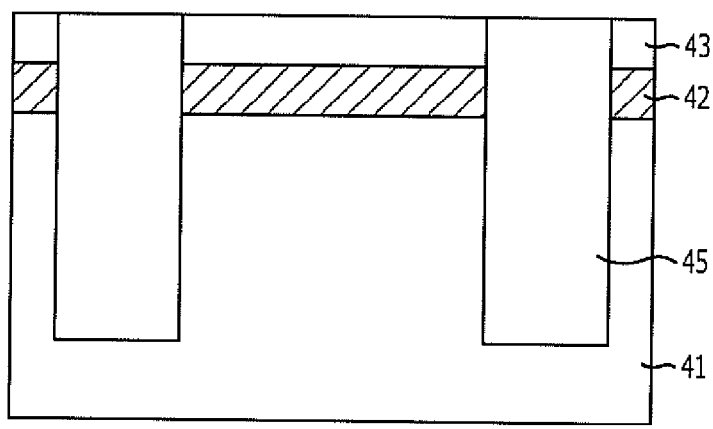

Referring to FIG. 3B, an insulating layer such as an SOD is formed to gap-fill the first trench 44 (see FIG. 3A) and then a planarization process such as a CMP is performed to form a device isolation layer 45.

Figure 3C:
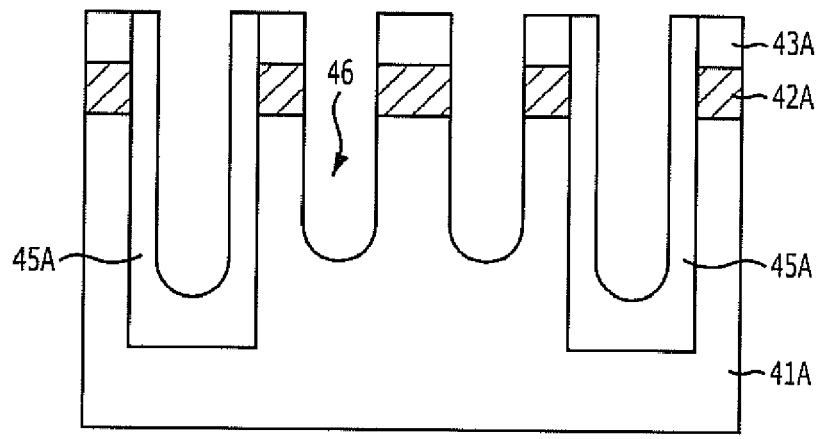

Referring to FIG. 3C, a mask and etch process is performed. For example, the hard mask layer 43 is etched by using a photoresist pattern (not shown), and then the plug conductive layer 42 and the substrate corresponding to a portion where a gate is being formed are etched using the etched hard mask pattern 43A as an etch barrier to form a second trench 46 having a predetermined depth in the substrate 41A and the device isolation layer 45A. Here, the second trench 46 may be formed by simultaneously etching the substrate 41 and the device isolation layer 45.

Thus, by etching the plug conductive layer 42 using the hard mask pattern 43A, a landing plug 45A is formed, and successively by etching the substrate between the landing plugs 45A (e.g., an area between a first and a second landing plug 45A), the second trench 46 is formed. At this time, the device isolation layer 34 has a hollow structure 34A.

Figure 3D:
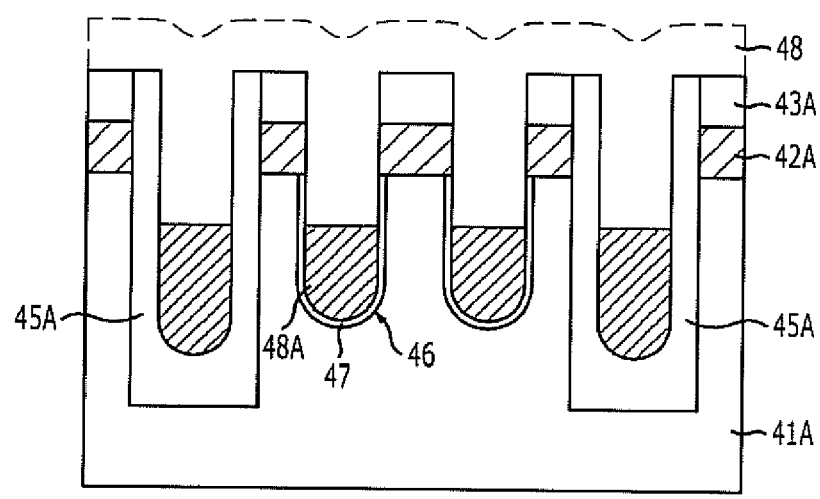

Referring to FIG. 3D, a gate insulation layer 47 is formed on a surface of the second trench 46 and then a gate conductive layer 48 is deposited on an entire surface of the resultant substrate such that the second trench 46 is gap-filled with the gate conductive layer 48. The gate conductive layer 48 includes a titanium nitride (TiN) layer, a tantalum nitride (TaN) layer, a tungsten (W) layer, or the like. For example, the gate conductive layer 48 may be formed by conformally and thinly depositing a titanium nitride layer (or tantalum nitride layer) having a large work function and then gap-filling a tungsten layer for lowering the resistance. Also, the gate conductive layer 48 may be formed by stacking a titanium nitride layer and a tantalum nitride layer, or sequentially stacking a titanium nitride layer, a tantalum nitride layer and a tungsten layer. Preferably, the titanium nitride layer is formed in a thickness range of 20-80 Å, although other thickness ranges are contemplated.

Next, the gate conductive layer 48 is planarized by using a CMP (Chemical Mechanical Polishing) process, or the like, such that a top surface of the hard mask pattern 43A is exposed, and an etchback is successively performed to form a buried gate 48A. The top surface of the buried gate 48A may be leveled lower than the top surface of the substrate 41.

Figure 3E:
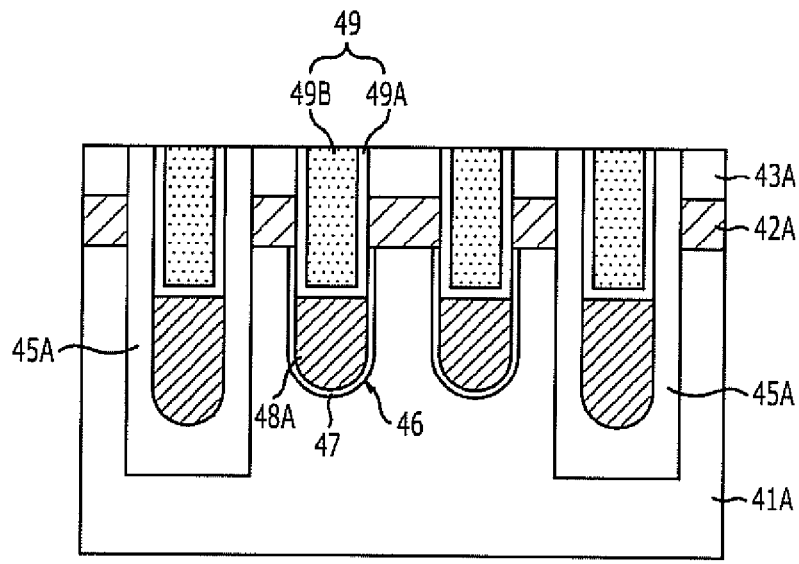

Referring to FIG. 3E, a sealing layer 49 sealing an upper portion of the buried gate 48A is formed. The sealing layer 49 may be selected from a group consisting of an oxide layer, a nitride layer and a stack structure of an oxide layer and a nitride layer. For example, the sealing layer 49 may be formed by thinly sealing a sealing nitride layer 49A and gap-filling a sealed space with a sealing oxide layer 49B such as an SOD (Spin On Dielectric), or the like.

If the sealing layer 49 covers the hard mask pattern 43A, the sealing layer 49 is planarized such that the top surface of the hard mask pattern 43A is exposed.

Figure 3F:
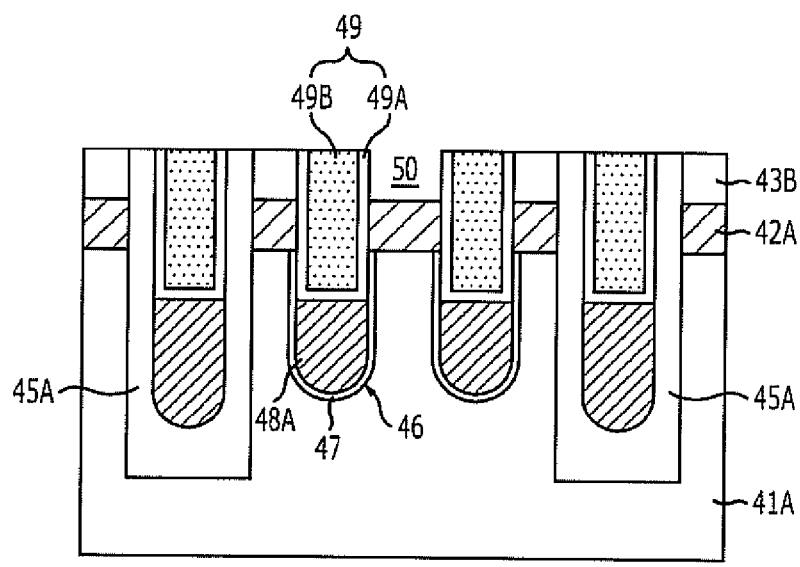

Referring to FIG. 3F, the hard mask pattern 43A (see FIG. 3E) is etched using a contact mask (not shown) to form a contact hole 50 partially exposing a top surface of the landing plug 45A. The hard mask pattern having the contact hole 50 formed becomes a final hard mask pattern 43B. The contact hole 50 includes a bit line contact hole or a storage node contact hole, preferably, the bit line contact hole. The contact hole 50 may be formed after an interlayer insulating layer is formed on the sealing layer 49.

According to the foregoing first and second embodiments, by forming the landing plug prior to forming the trench where the buried gate is being formed, it is possible to increase the contact area between the landing plug and the substrate. Accordingly, the contact resistance can be decreased.

Also, since the landing plug is formed not by forming of a contact hole, depositing a plug conductive layer and forming a trench, but instead by depositing a plug conductive layer and forming a trench, a contact open fail can be prevented and thus a bridging between neighboring landing plugs can be also prevented. Furthermore, since the contact hole etching process for forming the landing plug is not needed, substrate loss may be reduced, minimized or eliminated.

FIGS. 4A to 4J are cross-sectional views illustrating a method for fabricating a semiconductor device, according to a third embodiment.

Figure 4A:
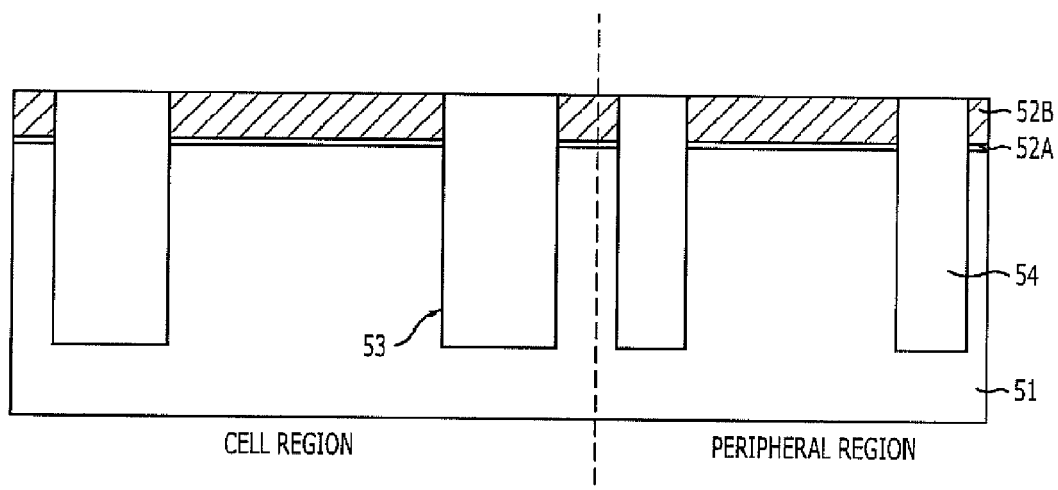
FIGS. 4A to 4J are cross-sectional views illustrating a method for fabricating a semiconductor device in accordance with a third embodiment.

Referring to FIG. 4A, a first trench 53 is formed through an etch process using a first hard mask layer 52B in a substrate 51, where a cell region and a peripheral region are defined. The first hard mask layer 52B may include a polysilicon layer or a nitride layer. Preferably, the first hard mask layer 52B may have a stack structure of a polysilicon layer and a nitride layer. A pad oxide layer 52A is formed below the first hard mask layer 52B.

Thereafter, a device isolation layer 54 for gap-filling the first trench 53 is formed. This process of forming the device isolation layer 54 is called 'STI (Shallow Trench Isolation)' process, and the device isolation layer 34 is formed by forming the first trench 53, and then gap-filling the first trench 53 with an insulating layer, such as an HDP layer, an SOD layer, or the like.

Figure 4B:
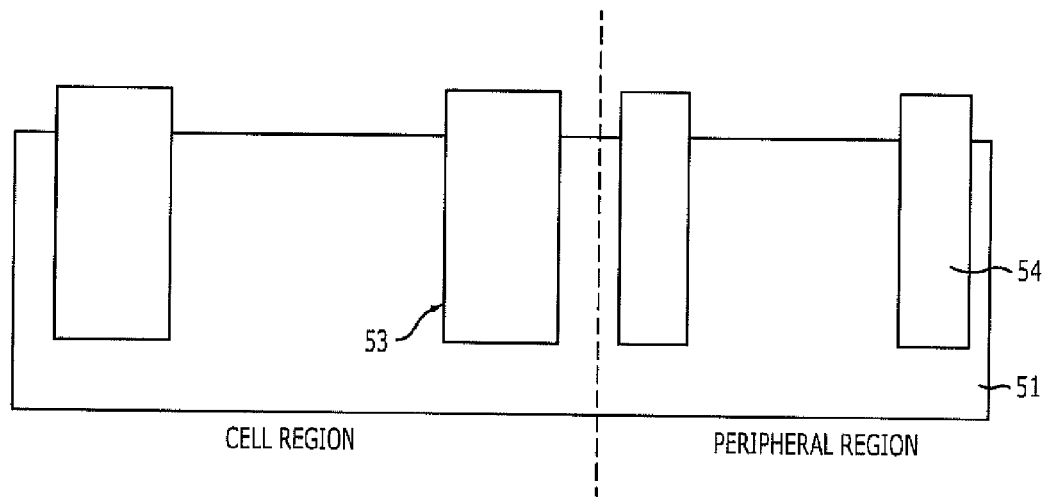

Referring to FIG. 4B, the first hard mask layer 52B and the pad oxide layer 52A are removed.

Figure 4C:
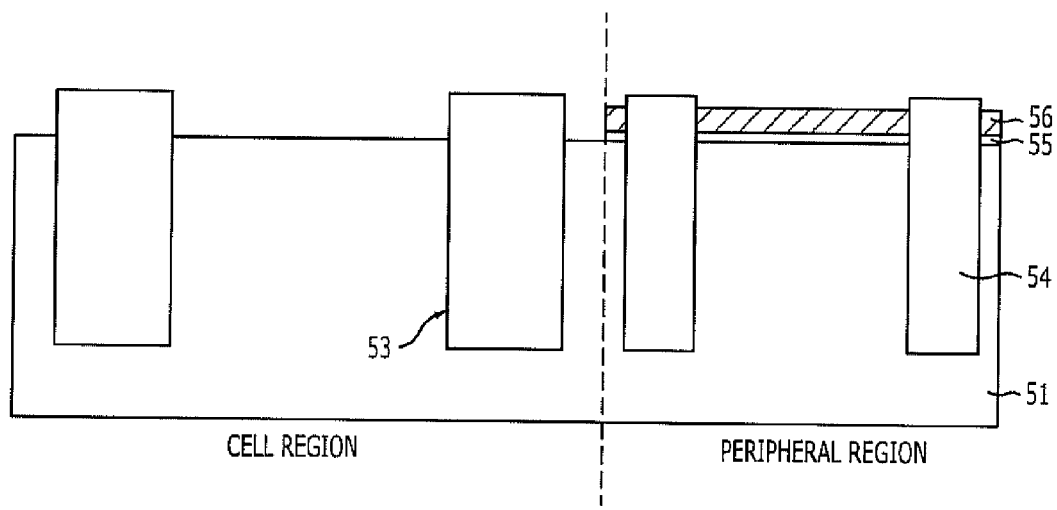

Next, referring to FIG. 4C, a first gate insulationinsulation layer is formed on the substrate 51 through a gate oxidation process, and then a first polysilicon layer is formed on the first gate insulationinsulation layer. The first polysilicon layer is formed in a thickness range of 100-500 Å, although other thickness ranges are contemplated.

The foregoing first gate insulation layer is for transistors of the peripheral region. Hereinafter, for convenience of description, the first gate insulation layer will be referred to as the 'peri gate insulation layer'.

Thereafter, the first polysilicon layer and the peri gate insulation layer 55 of the cell region are removed through a cell open process. As a result, the peri gate insulation layer 55 and the first polysilicon layer 56 are left only on the peripheral region.

Figure 4D:
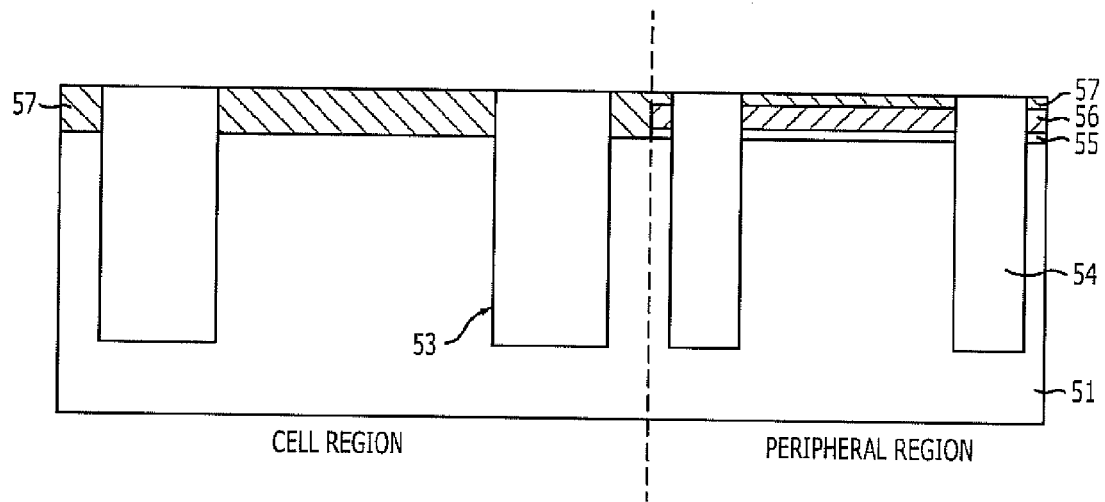

Referring to FIG. 4D, a second polysilicon layer is formed on an entire surface of the substrate 51, and is then planarized to remove a height difference between the cell region and the peripheral region. At this point, the second polysilicon layer 57 is a material layer used as a landing plug. In addition to the second polysilicon layer 57, a metal layer such as a tungsten layer, or the like, may be used as the landing plug.

As the second polysilicon layer 57 is formed, only a single layer of the second polysilicon layer 57 is placed in the cell region, and a double layer comprised of the first polysilicon layer 56 and the second polysilicon layer 57 stacked on the peri gate insulation layer 55 is placed in the peripheral region. The second polysilicon layer 57 in the cell region becomes a plug, and the second polysilicon layer 57 in the peripheral region becomes a part of a gate. The second polysilicon layer 57 is formed in a thickness range of 500-1000 Å, although other thickness ranges are contemplated.

Figure 4E:
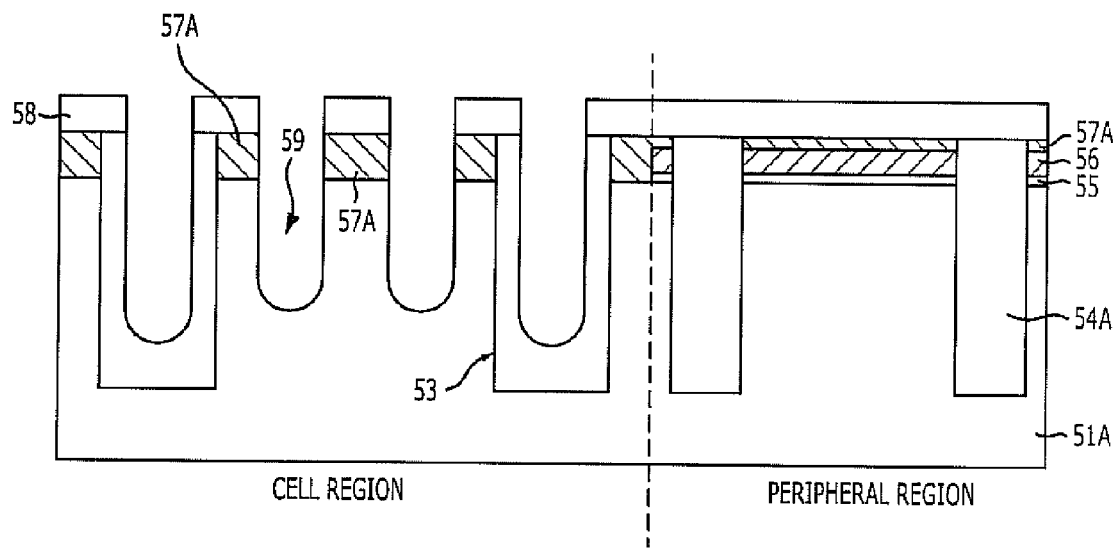

Referring to FIG. 4E, a second hard mask layer is formed on an entire surface of the substrate 51, including the second polysilicon layer 57 by using a nitride layer, and a mask and etch process for forming a buried gate is performed with respect to the cell region. For example, the second hard mask layer is etched by using a photoresist pattern (not shown) to form a second hard mask pattern 58, and then the second polysilicon layer 57 and the substrate 51 are etched by using the second hard mask pattern 58 as an etch barrier. As a result, a second trench 59 having a predetermined depth is formed in the cell region. The second trench 59 may be formed by simultaneously etching the substrate 51 and the device isolation layer 54. After the second trench 59 is formed, only the etched device isolation layer 54A is left on the substrate 51A.

Thus, by etching the second polysilicon layer 57 using the second hard mask pattern 58 (see FIG. 4D), a landing plug 57A is formed, and successively by etching the substrate between the landing plugs 57A (e.g., a first landing plug 57A and a second landing plug 57A), the second trench 59 is formed. Meanwhile, the second polysilicon layer still remains in the peripheral region, and the first polysilicon layer and the second polysilicon layer remaining in the peripheral region become a gate of the peripheral region.

Figure 4F:
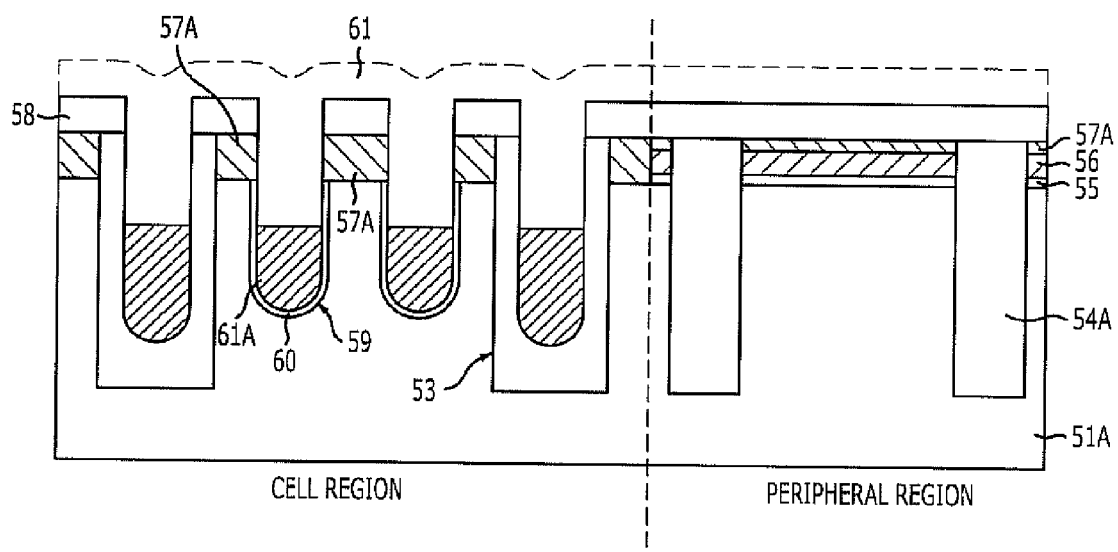

Referring to FIG. 4F, a second gate insulation layer 60 is formed on a surface of the second trench 59. The second gate insulation layer 60 is a gate insulation layer for gates of the cell region, and hereinafter will be referred to as the 'cell gate insulation layer 60'.

Thereafter, a metal layer 61 is deposited on an entire surface of the cell gate insulation layer 60 such that the second trench 59 is gap-filled with the metal layer 61. The metal layer 61 includes a titanium nitride (TIN) layer, a tantalum nitride (TaN) layer, a tungsten (W) layer, or the like. For example, the metal layer 61 may be formed by conformally and thinly depositing a titanium nitride layer (or tantalum nitride layer) having a large work function and then gap-filling a tungsten layer for lowering the resistance. Also, the metal layer 61 may be formed by stacking a titanium nitride layer and a tantalum nitride layer, or sequentially stacking a titanium nitride layer, a tantalum nitride layer and a tungsten layer. Preferably, the titanium nitride layer is formed in a thickness range of 20-80 Å, although other thickness ranges are contemplated.

Next, the metal layer 61 is planarized by using a CMP (Chemical Mechanical Polishing) process, or the like, such that a top surface of the second hard mask pattern 58 is exposed, and an etchback is successively performed to form a buried gate 61A. The top surface of the buried gate 61A may be leveled lower than the top surface of the substrate 51.

Figure 4G:
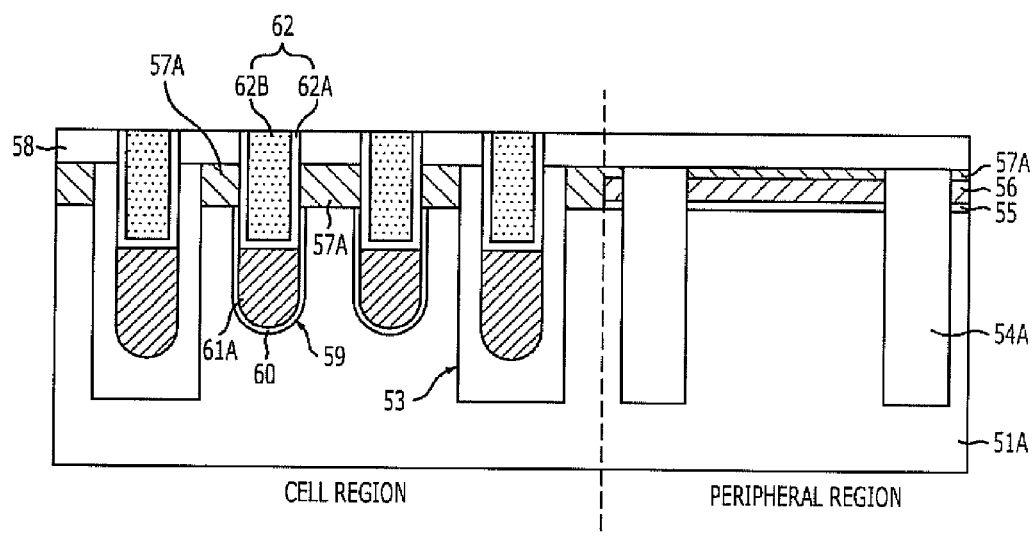

Referring to FIG. 4G, a sealing layer 62 sealing an upper portion of the buried gate 61A is formed. The sealing layer 62 may be selected from the group consisting of an oxide layer, a nitride layer and a stack structure of an oxide layer and a nitride layer. For example, the sealing layer 62 may be formed by thinly sealing a sealing nitride layer 62A and gap-filling a sealed space with a sealing oxide layer 62B, such as an SOD (Spin On Dielectric), or the like.

If the sealing layer 62 covers the second hard mask pattern 58, the sealing layer 62 is planarized, such that the top surface of the second hard mask pattern 58 is exposed.

Figure 4H:
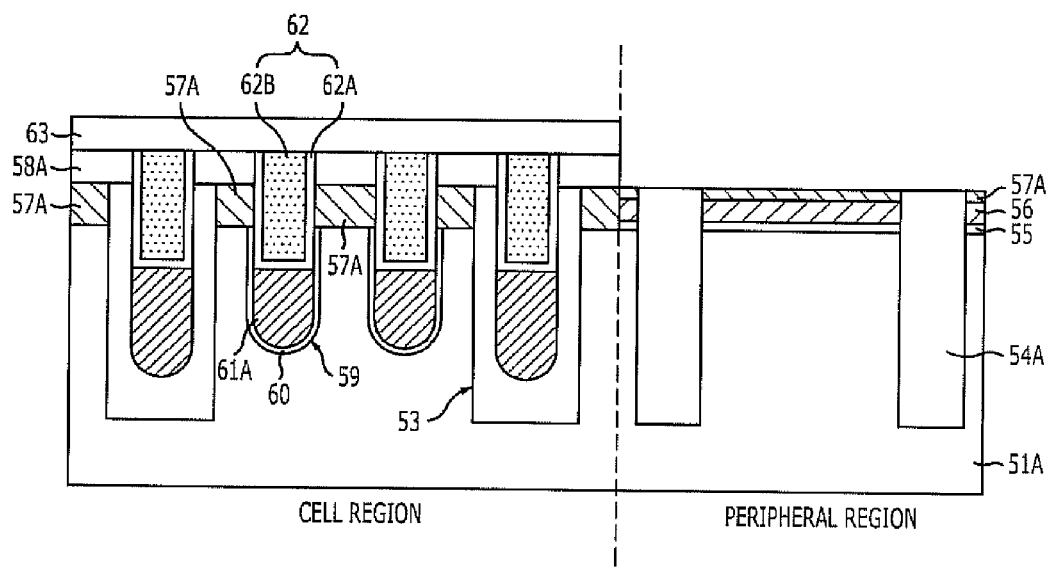

Referring to FIG. 4H, after a cell capping layer is formed on an entire surface of the substrate 51A, the peripheral region is opened. Thereafter, the cell capping layer of the peripheral region is removed, and the second hard mask pattern of the peripheral region is successively removed. The cell capping layer 63 includes an oxide layer or a nitride layer, and preferably may have a stack structure of a nitride layer (50-400 Å) and an oxide layer (50-200 Å), although other thickness ranges are contemplated. The nitride layer also functions as an etch stop layer in a subsequent etch process, and the oxide layer also functions as a capping layer in the peripheral region open process.

Resultantly, only the stack structure comprised of the peri gate insulation layer 55, the first polysilicon layer 56 and the second polysilicon layer 57A are left in the peripheral region, and the cell capping layer 63 and the second hard mask 58A are left in the cell region.

Figure 4I:
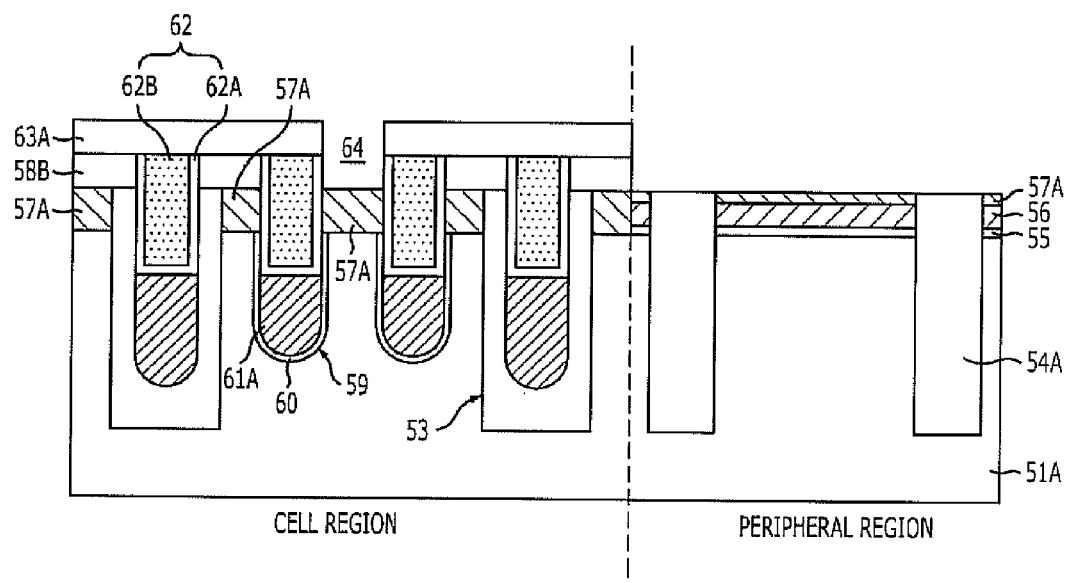

Referring to FIG. 4I, a bit line contact process is performed. That is, the cell capping layer 63 and the second hard mask layer 58 (see FIG. 4H) are etched to form a bit line contact hole 64 partially exposing the top surface of the landing plug 57A. As the bit line contact hole 64 is formed, the final second hard mask 58B and the etched sealing layer 63A remain. The etch process for forming the bit line contact hole 64 may be performed after the process illustrated in FIG. 4H is performed and an interlayer insulating layer is formed.

Figure 4J:
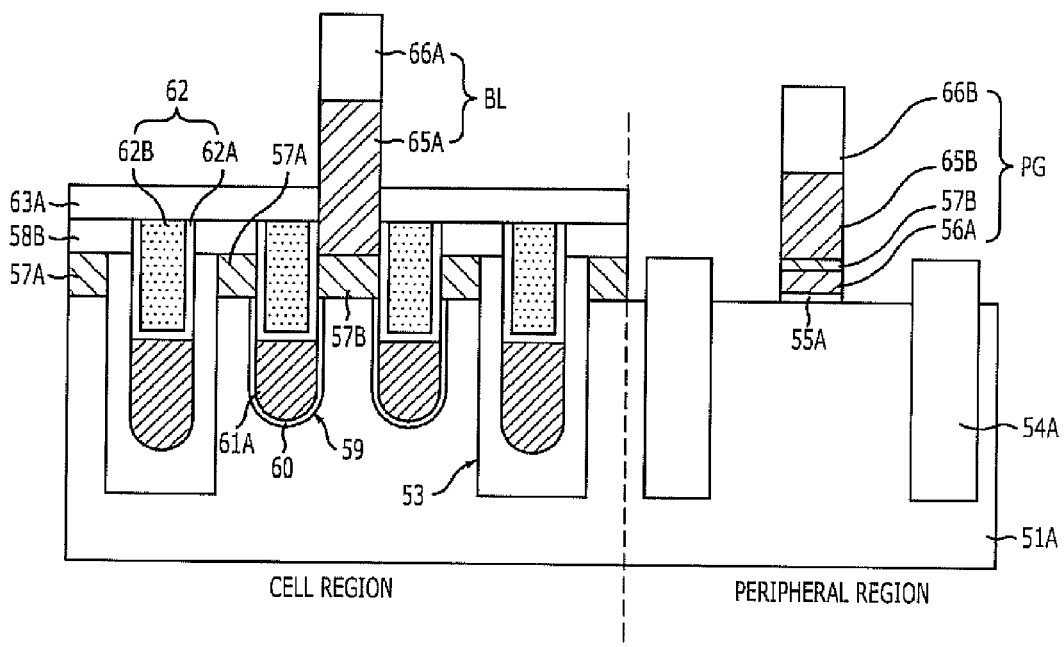

Referring to FIG. 4J, a metal layer and a hard mask layer are deposited on an entire surface of the resultant substrate such that the bit line contact hole 64 (see FIG. 4I) is filled, and then a gate etching is performed. The gate etching is for forming a peri gate in the peripheral region, and the bit line process in the cell region may be performed simultaneously with the gate etching in the peripheral region. The metal layer becomes a gate metal layer 65B in the peripheral region, and becomes a bit line metal layer 65A in the cell region. The hard mask layer becomes a gate hard mask layer 66B in the peripheral region, and becomes a bit line hard mask layer 66A in the cell region. The metal layer may include a tungsten layer, and the hard mask layer may include a nitride layer.

As a result, a peri gate (PG) is completed in the peripheral region, which is comprised of a first polysilicon layer 56A, a second polysilicon layer 57B, a gate metal layer 65B and a gate hard mask layer 66B sequentially stacked in the order named on a peri gate insulation layer 55A. While the peri gate is formed, a bit line (BL) is formed in the cell region, which is comprised of a bit line metal layer 65A and a bit line hard mask layer 66A stacked in the order named. The bit line metal layer 65A filled in the bit line contact hole also functions as a bit line contact. The peri gate insulation layer 55B may have a double gate oxide structure or a triple gate oxide structure, according to a structure of the peri gate.

FIGS. 5A to 5K are cross-sectional views illustrating a method for fabricating a semiconductor device in accordance with a fourth embodiment.

Figure 5A:
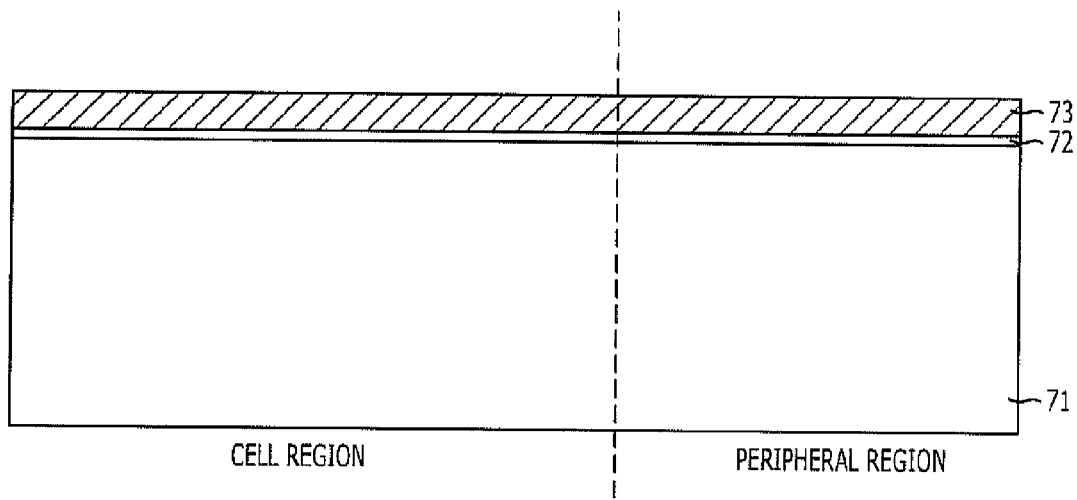
FIGS. 5A to 5K are cross-sectional views illustrating a method for fabricating a semiconductor device in accordance with a fourth embodiment.

Referring to FIG. 5A, a peri gate insulation layer 72 is formed through a gate oxidation process on a substrate 71 where a cell region and a peripheral region are defined, and a first polysilicon layer 73 is formed on the peri gate insulation layer 72. The first polysilicon layer 73 is formed in a thickness range of 100-500 Å, although other thickness ranges are contemplated.

Figure 5B:
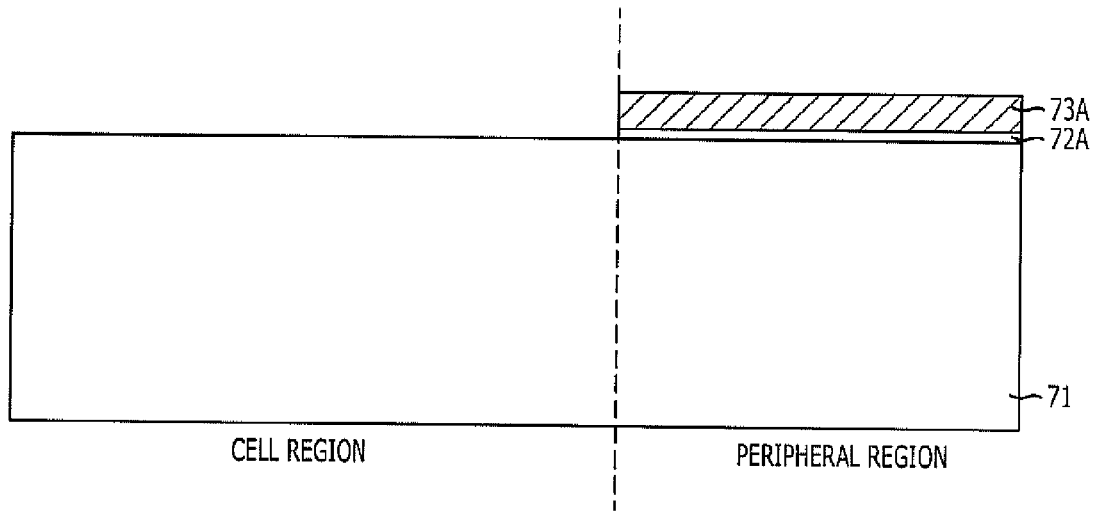

Referring to FIG. 5B, the first polysilicon layer 73 and the peri gate insulation layer 72 in the cell region are removed through a cell open process, so that the peri gate insulation layer 72A and the first polysilicon layer 73A are left only in the peripheral region.

Figure 5C:
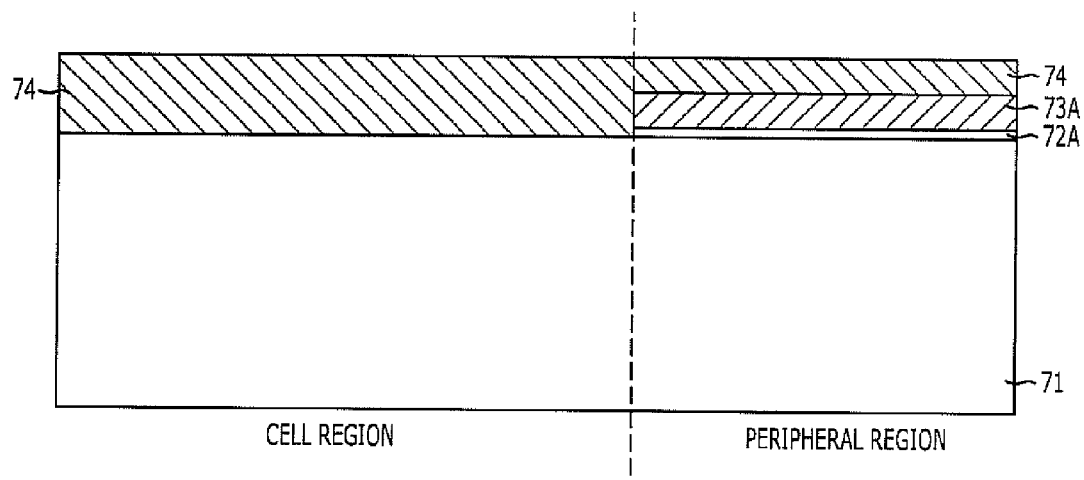

Referring to FIG. 5C, a second polysilicon layer is formed on an entire surface of the resultant substrate 71 and is then planarized to remove a height difference between the cell region and the peripheral region. At this point, the second polysilicon layer 74 is a plug conductive layer used as a landing plug. In addition, the plug conductive layer used as a landing plug may include a metal layer such as a tungsten layer, or the like.

Figure 5D:
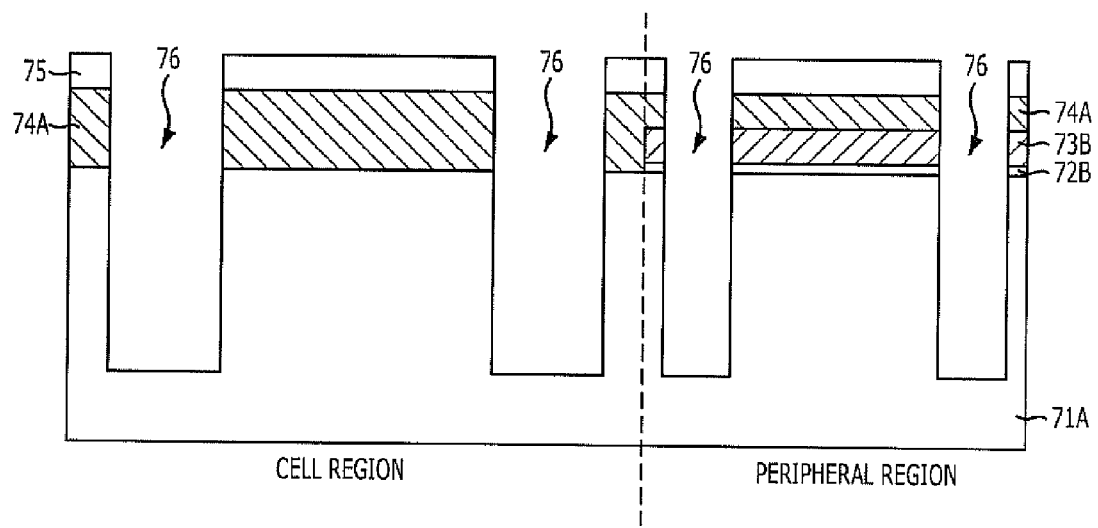

Referring to FIG. 5D, a hard mask layer is formed on the second polysilicon layer 74, and then an STI (Shallow Trench Isolation) process is performed for forming a device isolation layer. For example, the STI process is performed by etching the hard mask layer using a photoresist pattern (not shown), and etching the second polysilicon layer 73A and the substrate 71 (see FIG. 5C) is performed using the hard mask layer 75 as an etch barrier. Accordingly, a first trench 76 having a predetermined depth is formed in both the cell region and the peripheral region; according to an embodiment, two or more first trenches 76 may be formed as shown in FIG. 5D. In the peripheral region, the first trench 76 (or each of the first trenches 76) is formed by sequentially etching the second polysilicon layer 74, the first polysilicon layer 73A, the peri gate insulation layer 72A and the substrate 71. As seen from FIG. 5D, a peri gate insulation pattern 72B, a first polysilicon pattern 73B, a second polysilicon pattern 74A and the hard mask layer 75 are left on the substrate 71A having the first trench in the peripheral region, and the second polysilicon pattern 74A and the hard mask layer 75 are left on the substrate 71A in the cell region.

Figure 5E:
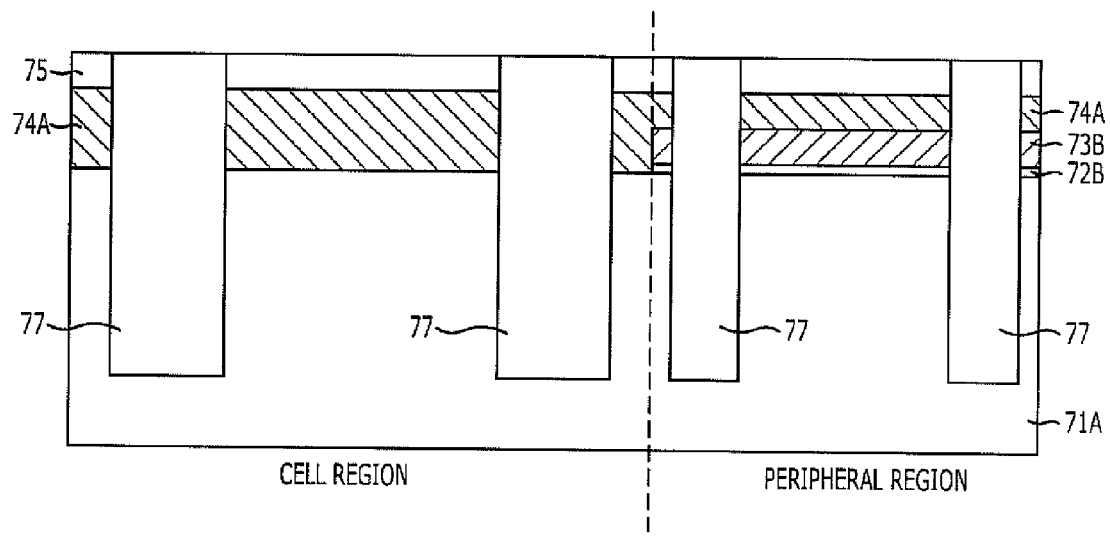

Referring to FIG. 5E, an insulating layer, such as an SOD layer, for gap-filling the first trench 76 is formed and is then planarized by using a CMP process to form a device isolation layer 77.

Figure 5F:
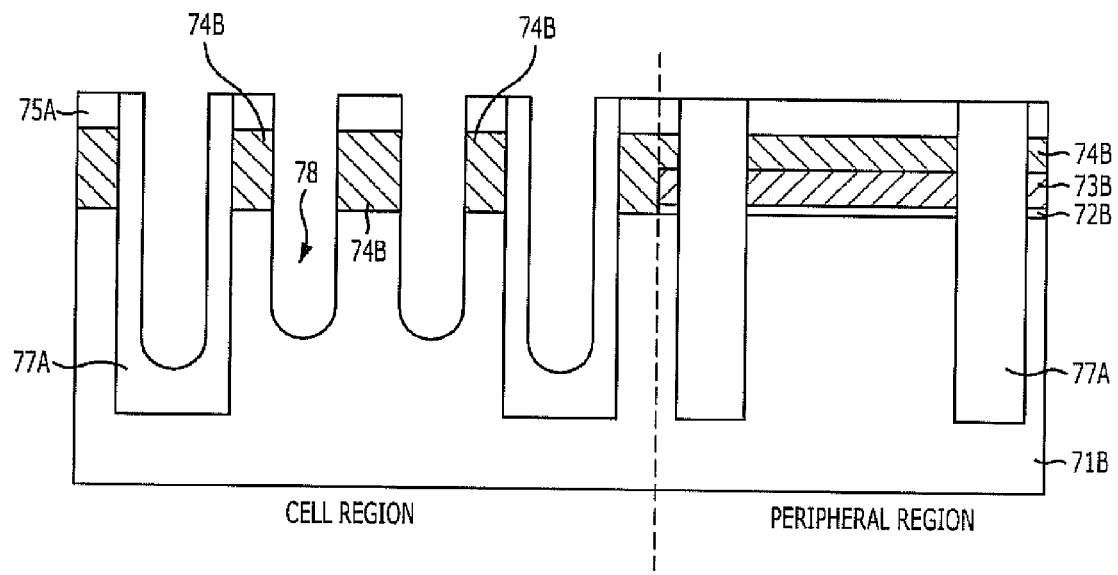

Referring to FIG. 5F, a mask and etch process for forming a buried gate in the cell region is performed. For example, the hard mask layer 75 is etched by using a photoresist pattern (not shown) to form a hard mask pattern 75A, and then the second polysilicon pattern 74A and the substrate 71A (see FIG. 5E) are etched by using the hard mask pattern 75 as an etch barrier. Accordingly, a second trench 78 having a predetermined depth is formed in the cell region. The second trench 78 may be formed by simultaneously etching the substrate 71A and the device isolation layer 77 in the cell region.

Thus, by etching the second polysilicon pattern 74A using the hard mask pattern 75A, a landing plug 74B is formed (according to an embodiment, two or more landing plugs 74B may be formed as shown), and successively by etching the substrate between the landing plugs 74B, the second trench 78 is formed in the substrate 71B and the device isolation layer 77A.

Figure 5G:
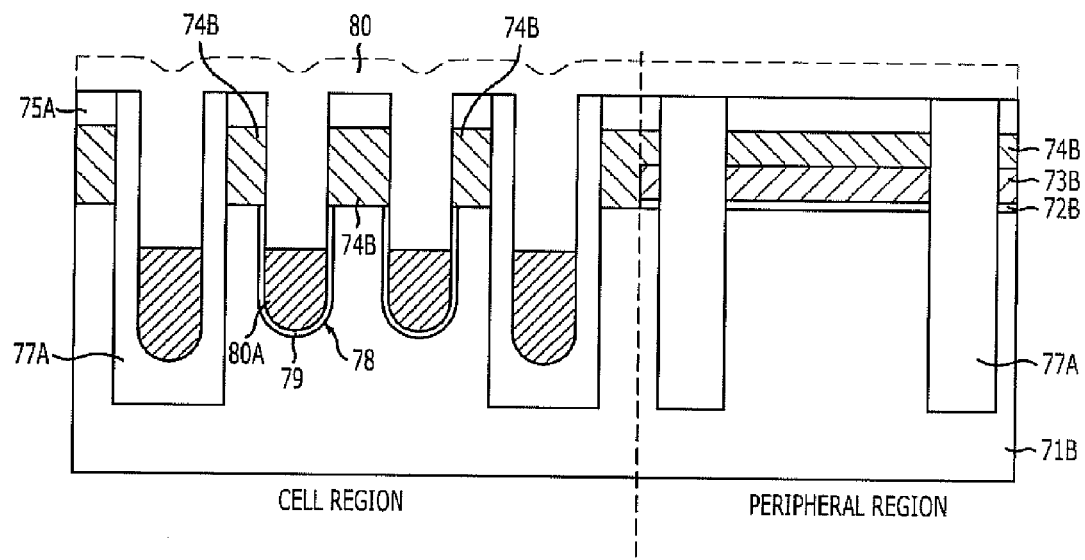

Referring to FIG. 5G, a cell gate insulation layer 79 is formed on a surface of the second trench 78, and then a metal layer 80 is deposited on an entire surface of the cell gate insulation layer 79 such that the second trench 78 is gap-filled with the metal layer 80. The metal layer 80 includes a titanium nitride (TiN) layer, a tantalum nitride (TaN) layer, a tungsten (W) layer, or the like. For example, the metal layer 80 may be formed by conformally and thinly depositing a titanium nitride layer (or tantalum nitride layer) having a large work function, and then gap-filling a tungsten layer for lowering the resistance. Also, the metal layer 80 may be formed by stacking a titanium nitride layer and a tantalum nitride layer, or sequentially stacking a titanium nitride layer, a tantalum nitride layer and a tungsten layer. Preferably, the titanium nitride layer is formed in a thickness range of 20-80 Å, although other thickness ranges are contemplated.

Next, the metal layer 80 is planarized by using a CMP (Chemical Mechanical Polishing) process, or the like, such that a top surface of the hard mask pattern 75A is exposed, and an etchback is successively performed to form a buried gate 80A. The top surface of the buried gate 80A may be leveled lower than the top surface of the substrate 71B.

Figure 5H:
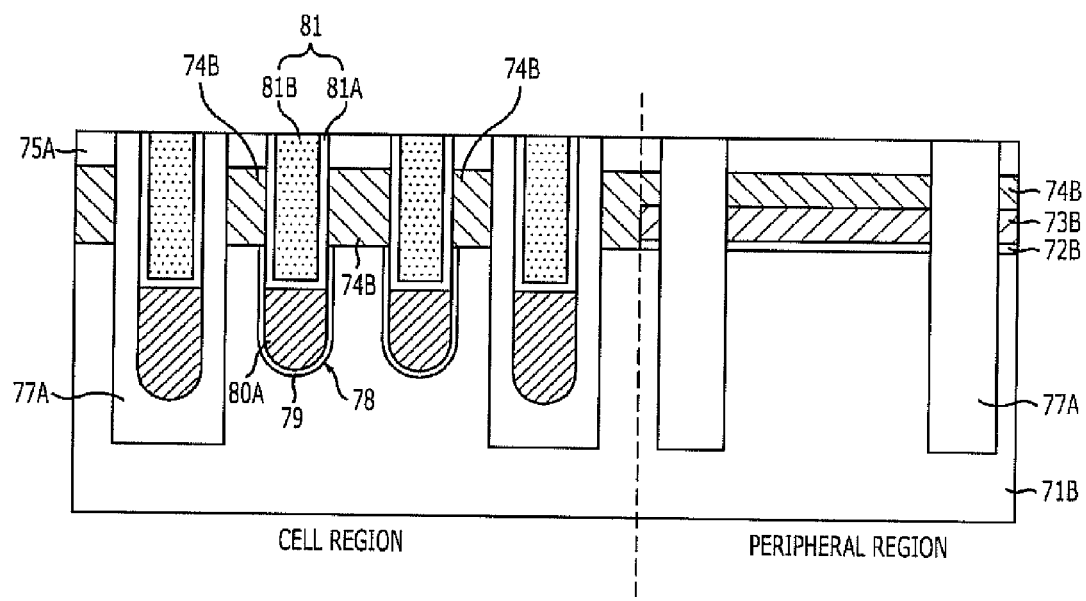

Referring to FIG. 5H, a sealing layer 81 sealing an upper portion of the buried gate 80A is formed. The sealing layer 81 may be selected from the group consisting of an oxide layer, a nitride layer and a stack structure of an oxide layer and a nitride layer. For example, the sealing layer 81 may be formed by thinly sealing a sealing nitride layer 81A, and gap-filling a sealed space with a sealing oxide layer 81B such as an SOD (Spin On Dielectric), or the like.

If the sealing layer 81 exists on the hard mask pattern 75A, the sealing layer 81 is planarized such that the top surface of the hard mask pattern 75A is exposed.

Figure 5I:
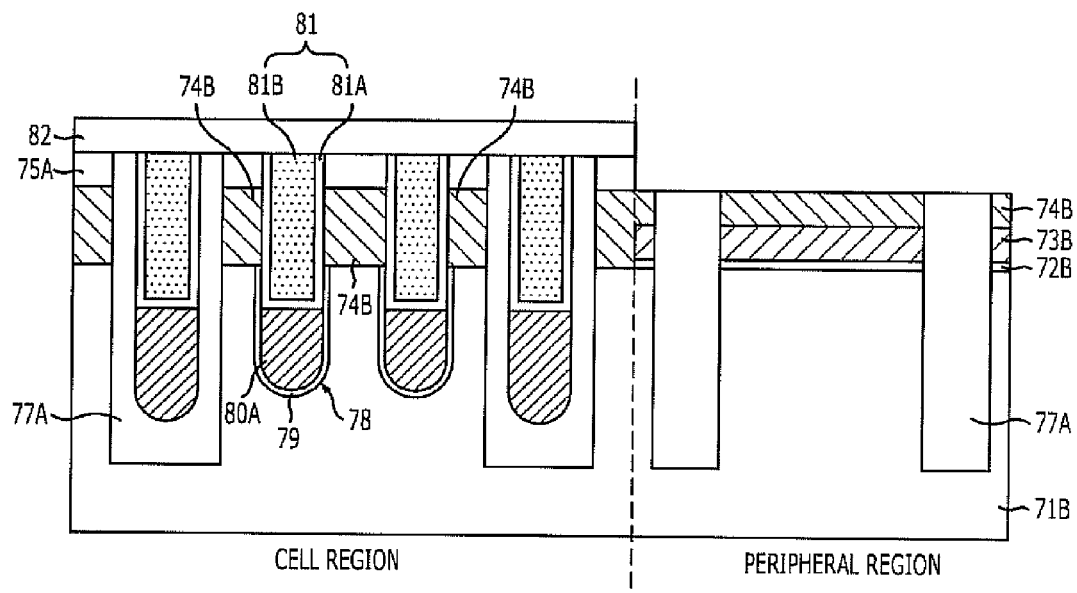

Referring to FIG. 5I, after a cell capping layer 82 is formed on an entire surface of the substrate, the peripheral region is opened. Thereafter, the cell capping layer of the peripheral region is removed, and the hard mask pattern of the peripheral region is successively removed. The cell capping layer 82 remaining in the cell region includes an oxide layer or a nitride layer, and preferably may have a stack structure of a nitride layer (50-400 Å) and an oxide layer (50-200 Å), although other ranges are contemplated. The nitride layer also functions as an etch stop layer in a subsequent etch process, and the oxide layer also functions as a capping layer in the peripheral region open process.

Resultantly, only the stack structure comprised of the peri gate insulation layer 72A, the first polysilicon pattern 73B and the second polysilicon pattern 74B are left in the peripheral region.

Figure 5J:
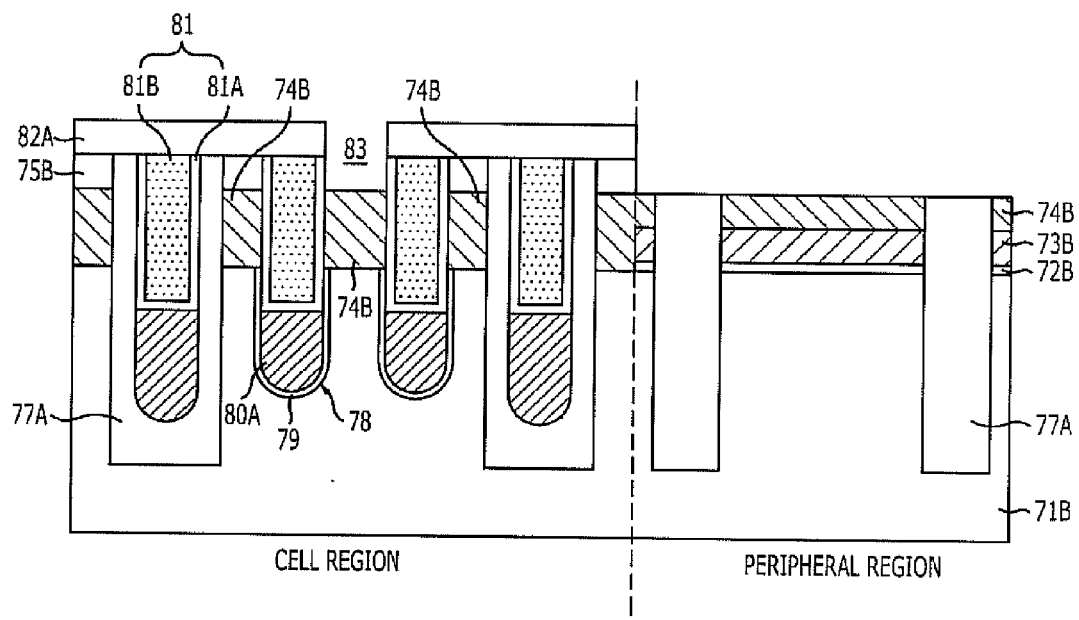

Referring to FIG. 5J, a bit line contact process is performed. That is, the cell capping layer 82 and the hard mask pattern 75A (see FIG. 5I) are etched to form a bit line contact hole 83 partially exposing the top surface of the landing plug 74B. The hard mask pattern 75A and the cell capping layer 82 in which the bit line contact hole 83 is not formed remain as a final hard mask pattern 75B and a cell capping pattern 82A. The etch process for forming the bit line contact hole 83 may be performed after the process illustrated in FIG. 5I is performed and an interlayer insulating layer is formed.

Figure 5K:
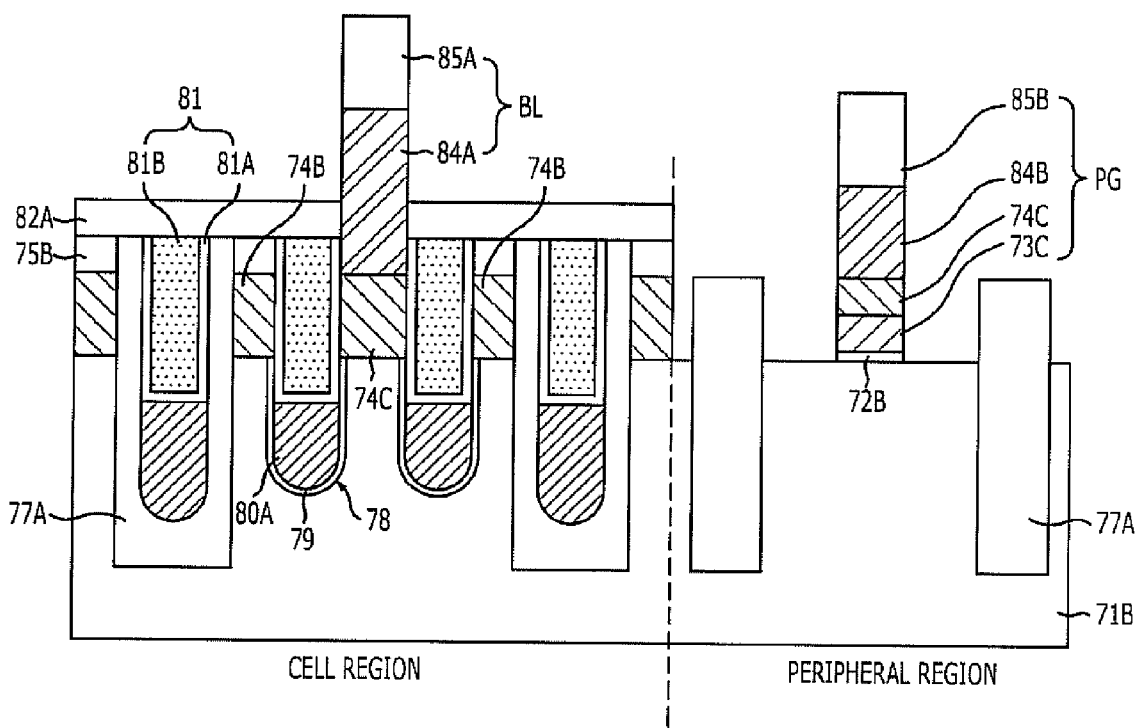

Referring to FIG. 5K, a metal layer and a gate hard mask layer are deposited on an entire surface of the resultant substrate such that the bit line contact hole 83 is filled, and then a gate etching is performed. The gate etching is for forming a peri gate in the peripheral region, and the bit line process in the cell region may be performed simultaneously with the gate etching in the peripheral region. The metal layer becomes a gate metal layer in the peripheral region, and becomes a bit line metal layer in the cell region. The hard mask layer becomes a gate hard mask layer in the peripheral region, and becomes a bit line hard mask layer in the cell region. The metal layer may include a tungsten layer and the hard mask layer may include a nitride layer.

As a result, a peri gate (PG) is completed in the peripheral region, which is comprised of a final first polysilicon pattern 73C, a final second polysilicon pattern 74C, a gate metal layer 84B and a gate hard mask layer 85B sequentially stacked in the order named on a peri gate insulation layer 72B. While the peri gate is formed, a bit line (BL) is formed in the cell region, which is comprised of a bit line metal layer 84A and a bit line hard mask layer 85A stacked in the order named. The bit line metal layer 84A filled in the bit line contact hole also functions as a bit line contact. The peri gate insulation layer 72B may have a double gate oxide structure or a triple gate oxide structure, according to a structure of the peri gate.

According to the foregoing third and fourth embodiments, since the landing plug is formed after the second polysilicon layer used as the plug conductive layer is formed, before the second trench in which the buried gate is being formed is formed, it is possible to increase the contact area between the landing plug and the substrate, so that the contact resistance can be decreased.

Also, since the landing plug is formed not through forming of a contact hole and depositing and etching of a plug conductive layer, but through depositing of a plug conductive layer and a trench etching, a contact open fail can be prevented, and thus a bridging between neighboring landing plugs can be also prevented. Furthermore, since the contact hole etching process for forming the landing plug is not needed, substrate loss may be reduced, minimized or eliminated.

Furthermore, since the gate oxidation and the deposition of the first polysilicon layer among processes for forming the peri gate are completed before forming of the buried gate, oxidation of the buried gate which may be caused during the gate oxidation for the peri gate can be prevented.

In accordance with the embodiments described above, the stability of the buried gate can be secured, the peri gate can be easily formed, and a process margin in a contact process between the buried gate and the bit line, or between the buried gate and the storage node contact after the buried gate is formed can be secured.

Also, in the peripheral region, the gate oxidation and the deposition of the gate conductive layer are performed, and in the cell region, the landing plug is first formed, and then the device isolation process and the buried gate process are performed. As a result, the contact resistance can be lowered, and a sufficient contact area can be secured to prevent not-open, contact-not-open, bridging, and/or other conditions, which may be caused when the landing plug is formed in a subsequent contact process.

Furthermore, since the process of forming the peri gate can be completed prior to forming of a device isolation trench, oxidation of the buried gate, which may be generated in forming the peri gate, can be prevented to secure stable devices, and the number of subsequent contact processes or material removing processes can be decreased to simplify the process steps.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plug conductive layer over an entire surface of a substrate;
    etching the plug conductive layer to form landing plugs;
    etching the substrate between the landing plugs to form a trench;
    forming a gate insulation layer over along an internal surface of an opening for the trench without forming the gate insulation layer over the top surface of the etched substrate surrounding the opening;
    forming a buried gate over the gate insulation layer to fill a lower portion of the trench; and
    forming a sealing layer over the buried gate to fill an upper portion of the trench.

2. The method of claim 1, further comprising:
    forming a contact hole exposing a surface of each of the landing plugs.

3. The method of claim 1, wherein the sealing layer comprises one selected from the group consisting of an oxide layer, a nitride layer and a double-layered structure comprising a nitride layer and an oxide layer.

4. The method of claim 1, wherein the plug conductive layer comprises a metal layer or a polysilicon layer.

5. The method of claim 1, wherein the forming of each of the landing plugs and the trench is performed by using a hard mask layer as an etch barrier.

6. A method for fabricating a semiconductor device, comprising:
    forming a plug conductive layer over an entire surface of a substrate;

etching the plug conductive layer and the substrate to form a first trench;

forming a device isolation layer gap-filling the first trench;

etching the plug conductive layer to form landing plugs;

etching the substrate between the landing plugs to form a second trench;

forming a gate insulation layer over a surface of the second trench; and forming a buried gate partially filling the second trench over the gate insulation layer.

7. The method of claim 6, further comprising:

forming a sealing layer gap-filling an upper portion of the buried gate; and forming a contact hole exposing the plug conductive layer.

8. The method of claim 7, wherein the sealing layer comprises one selected from the group consisting of an oxide layer, a nitride layer and a double-layered structure comprising a nitride layer and an oxide layer.

9. The method of claim 6, wherein the plug conductive layer comprises a metal layer or a polysilicon layer.

10. The method of claim 6, wherein the forming of each of the landing plugs and the second trench is performed by using a hard mask layer as an etch barrier.

11. The method of claim 6, further comprising a hard mask nitride layer over the plug conductive layer, wherein the hard mask nitride layer is removed while the buried gate is formed.

12. A method for fabricating a semiconductor device, comprising:

forming a device isolation layer in a substrate;

forming a plug conductive layer over an entire surface of the substrate;

etching the plug conductive layer to form landing plugs;

etching the substrate between the landing plugs to form a trench;

forming a gate insulation layer along an internal surface of an opening for the trench without forming the gate insulation layer over the top surface of the etched substrate surrounding the opening;

forming a buried gate over the gate insulation layer to fill a lower portion of the trench ; and forming a sealing layer over the buried gate to fill an upper portion of the trench.

13. The method of claim 12, further comprising:

forming a contact hole exposing a surface of each of the landing plugs.

14. The method of claim 12, wherein the sealing layer comprises one selected from the group consisting of an oxide layer, a nitride layer and a double-layered structure comprising a nitride layer and an oxide layer.

15. The method of claim 12, wherein the plug conductive layer comprises a metal layer or a polysilicon layer.

16. The method of claim 12, wherein the forming of each of the landing plugs and the trench is performed by using a hard mask layer as an etch barrier.

17. A method for fabricating a semiconductor device, comprising:

selectively forming a gate insulation layer and a gate conductive layer over a peripheral region of a substrate in which a cell region and the peripheral region are defined;

forming a plug conductive layer over an entire surface of the substrate;

etching the plug conductive layer to form landing plugs in the cell region;

etching the substrate between the landing plugs to form a trench;

forming a gate insulation layer over a surface of the trench;

forming a buried gate partially filling the trench over the gate insulation layer; and performing a gate patterning for forming a gate in the peripheral region.

18. The method of claim 17, prior to the performing of the gate patterning, further comprising:

forming a sealing layer gap-filling an upper portion of the buried gate;

forming a capping layer covering an entire surface of the substrate including the sealing layer; and etching the capping layer such that the peripheral region is opened.

19. The method of claim 18, wherein the sealing layer comprises one selected from the group consisting of an oxide layer, a nitride layer and a double-layered structure comprising a nitride layer and an oxide layer.

20. The method of claim 18, wherein the capping layer is formed by stacking a nitride layer and an oxide layer.

21. The method of claim 18, further comprising partially etching the capping layer remaining in the cell region to form a contact hole exposing a surface of each of the landing plugs.

22. The method of claim 17, wherein the plug conductive layer comprises a metal layer or a polysilicon layer.

23. The method of claim 17, wherein the forming of each of the landing plugs and the trench is performed by using a hard mask layer as an etch barrier.

24. The method of claim 17, wherein the selective forming of the gate insulation layer and the gate conductive layer in the peripheral region comprises:

sequentially forming the gate insulation layer and the gate conductive layer over an entire surface of the substrate; and performing a cell region-opening process to remain the gate conductive layer and the gate insulation layer in the peripheral region.

25. A method for fabricating a semiconductor device, comprising:

selectively forming a gate insulation layer and a gate conductive layer over a peripheral region of a substrate in which a cell region and the peripheral region are defined;

forming a plug conductive layer over an entire surface of the substrate;

etching the plug conductive layer and the substrate to form a first trench;

forming a device isolation layer gap-filling the first trench;

etching the plug conductive layer to form landing plugs in the cell region;

etching the substrate between the landing plugs to form a second trench;

forming a gate insulation layer over a surface of the second trench;

forming a buried gate partially filling the second trench over the gate insulation layer; and performing a gate patterning for forming a gate in the peripheral region.

26. The method of claim 25, prior to the performing of the gate patterning, further comprising:

forming a sealing layer gap-filling an upper portion of the buried gate;

forming a capping layer covering an entire surface of the substrate including the sealing layer; and etching the capping layer such that the peripheral region is opened.

27. The method of claim 26, wherein the sealing layer comprises one selected from the group consisting of an oxide layer, a nitride layer and a double-layered structure comprising a nitride layer and an oxide layer.

28. The method of claim 26, wherein the capping layer is formed by stacking a nitride layer and an oxide layer.

29. The method of claim 26, further comprising partially etching the capping layer remaining in the cell region to form a contact hole exposing a surface of each of the landing plugs.

30. The method of claim 25, wherein the plug conductive layer comprises a metal layer or a polysilicon layer.

31. The method of claim 25, wherein the forming of each of the landing plugs and the second trench is performed by using a hard mask layer as an etch barrier.

32. The method of claim 25, wherein the selective forming of the gate insulation layer and the gate conductive layer in the peripheral region comprises:
sequentially forming the gate insulation layer and the gate conductive layer over an entire surface of the substrate; and
performing a cell region-opening process to remain the gate conductive layer and the gate insulation layer only in the peripheral region.

33. The method of claim 25, further comprising a hard mask nitride layer over the plug conductive layer, wherein the hard mask nitride layer is removed while the buried gate is formed.

34. A method for fabricating a semiconductor device, comprising:
forming a device isolation layer in a substrate in which a cell region and a peripheral region are defined;
selectively forming a gate insulation layer and a gate conductive layer over the substrate of the peripheral region;
forming a plug conductive layer over an entire surface of the substrate;
etching the plug conductive layer to form landing plugs in the cell region;
etching the substrate between the landing plugs to form a trench;
forming a gate insulation layer over a surface of the trench;
forming a buried gate partially filling the trench over the gate insulation layer; and
performing a gate patterning for forming a gate in the peripheral region.

35. The method of claim 34, prior to the performing of the gate patterning, further comprising:
forming a sealing layer gap-filling an upper portion of the buried gate;
forming a capping layer covering an entire surface of the substrate including the sealing layer; and
etching the capping layer such that the peripheral region is opened.

36. The method of claim 35, wherein the sealing layer comprises one selected from the group consisting of an oxide layer, a nitride layer and a double-layered structure comprising a nitride layer and an oxide layer.

37. The method of claim 35, wherein the capping layer is formed by stacking a nitride layer and an oxide layer.

38. The method of claim 34, further comprising partially etching the capping layer remaining in the cell region to form a contact hole exposing a surface of each of the landing plugs.

39. The method of claim 34, wherein the plug conductive layer comprises a metal layer or a polysilicon layer.

40. The method of claim 34, wherein the forming of each of the landing plugs and the trench is performed by using a hard mask layer as an etch barrier.

41. The method of claim 34, wherein the selective forming of the gate insulation layer and the gate conductive layer in the peripheral region comprises:
sequentially forming the gate insulation layer and the gate conductive layer over an entire surface of the substrate; and
performing a cell region-opening process to remain the gate conductive layer and the gate insulation layer in the peripheral region.

* * * * *